(12) United States Patent
Chae et al.

(10) Patent No.: US 9,343,644 B2
(45) Date of Patent: May 17, 2016

(54) LIGHT EMITTING DIODE MODULE FOR SURFACE MOUNT TECHNOLOGY AND METHOD OF MANUFACTURING THE SAME

(71) Applicant: Seoul Viosys Co., Ltd., Ansan-si (KR)

(72) Inventors: Jong Hyeon Chae, Ansan-si (KR); Jong Min Jang, Ansan-si (KR); Won Young Roh, Ansan-si (KR); Dae Woong Suh, Ansan-si (KR); Min Woo Kang, Ansan-si (KR); Joon Sub Lee, Ansan-si (KR); Hyun A Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/588,878

(22) Filed: Jan. 2, 2015

(65) Prior Publication Data

US 2015/0108528 A1    Apr. 23, 2015

Related U.S. Application Data

(63) Continuation-in-part of application No. PCT/KR2013/005557, filed on Jun. 24, 2013.

(30) Foreign Application Priority Data

Jul. 2, 2012    (KR) .................. 10 2012 0071576

(51) Int. Cl.
*H01L 33/62* (2010.01)
*H01L 33/20* (2010.01)
*H01L 33/38* (2010.01)
*H01L 33/40* (2010.01)
*H01L 33/50* (2010.01)
(Continued)

(52) U.S. Cl.
CPC ............... *H01L 33/62* (2013.01); *H01L 33/20* (2013.01); *H01L 33/385* (2013.01); *H01L 33/405* (2013.01); *H01L 33/507* (2013.01); *H01L 33/32* (2013.01); *H01L 33/44* (2013.01); *H01L 2224/16* (2013.01); *H01L 2933/0016* (2013.01); *H01L 2933/0058* (2013.01)

(58) Field of Classification Search
CPC ........ H01L 33/62; H01L 33/507; H01L 33/20; H01L 33/385; H01L 33/405
See application file for complete search history.

(56) References Cited

U.S. PATENT DOCUMENTS 6,538,299 B1 * 3/2003 Kwark et al. .................. 257/458
7,511,311 B2 * 3/2009 Kususe et al. .................. 257/95

(Continued)

FOREIGN PATENT DOCUMENTS

JP    2006108161 A    4/2006
JP    2007080899 A    3/2007
JP    2009188422 A    8/2009

OTHER PUBLICATIONS

Hye Lyun Park, Authorized Officer, Korean Intellectual Property Office, International Search Report, PCT Application No. PCT/KR2013/005557, Sep. 25, 2013, 2 pages.

*Primary Examiner* — William Coleman
(74) *Attorney, Agent, or Firm* — Perkins Coie LLP

(57) ABSTRACT

Provided is a light emitting diode (LED) in which a side surface of a reflective metal layer has a predetermined angle, and occurrence of cracks in a conductive barrier layer formed on the reflective metal layer can be prevented. Also, an LED module using LEDs is disclosed. A reflection pattern electrically connected to a second semiconductor layer is partially exposed by patterning a first insulating layer. Accordingly, a first pad is formed through the partially opened first pad region. Also, a conductive reflection layer electrically connected to a first semiconductor layer forms a second pad region formed by patterning a second insulating layer. A second pad is formed on the second pad region.

20 Claims, 21 Drawing Sheets

(51) Int. Cl.
  *H01L 33/44*   (2010.01)
  *H01L 33/32*   (2010.01)

(56) References Cited

U.S. PATENT DOCUMENTS

| | | | |
|---|---|---|---|
| 8,101,964 B2 | 1/2012 | Kitagawa et al. | |
| 8,168,966 B2* | 5/2012 | Biwa et al. | 257/13 |
| 8,546,836 B2* | 10/2013 | Kamiya et al. | 257/99 |
| 2007/0262338 A1 | 11/2007 | Higashi et al. | |
| 2012/0049219 A1 | 3/2012 | Kamiya et al. | |
| 2013/0032810 A1* | 2/2013 | Chen | 257/76 |
| 2015/0108525 A1* | 4/2015 | Chae et al. | 257/98 |

* cited by examiner

Fig. 12
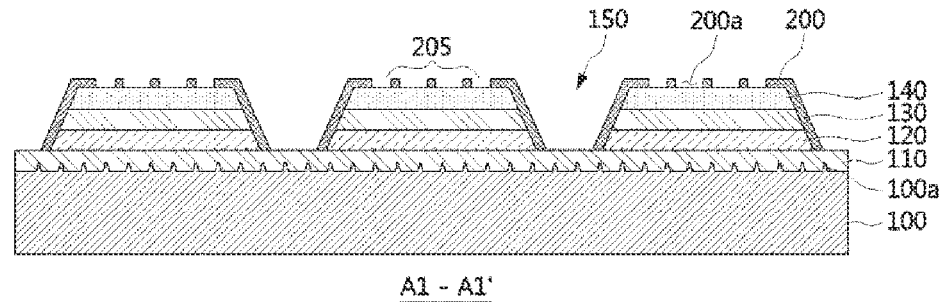
A1 - A1'
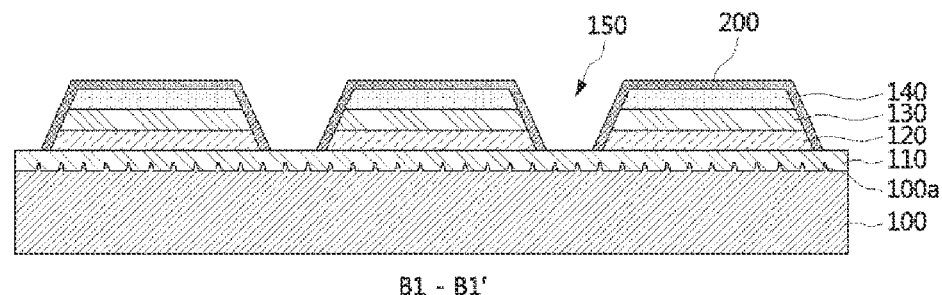
B1 - B1'
Fig. 13
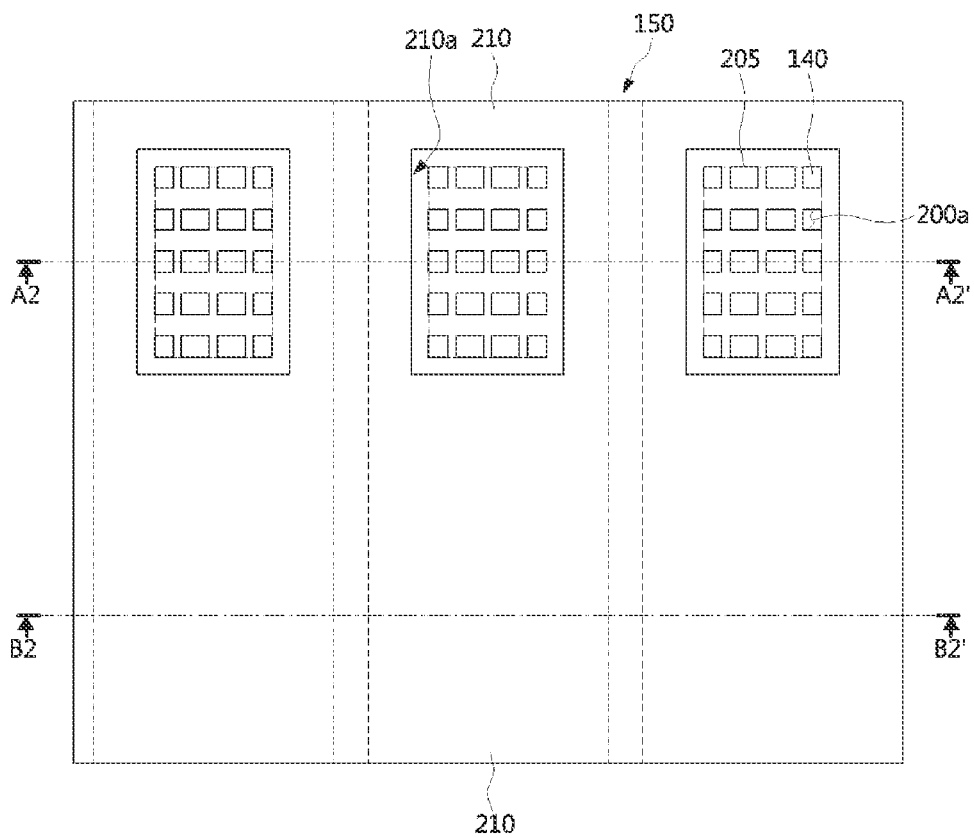

Fig. 14
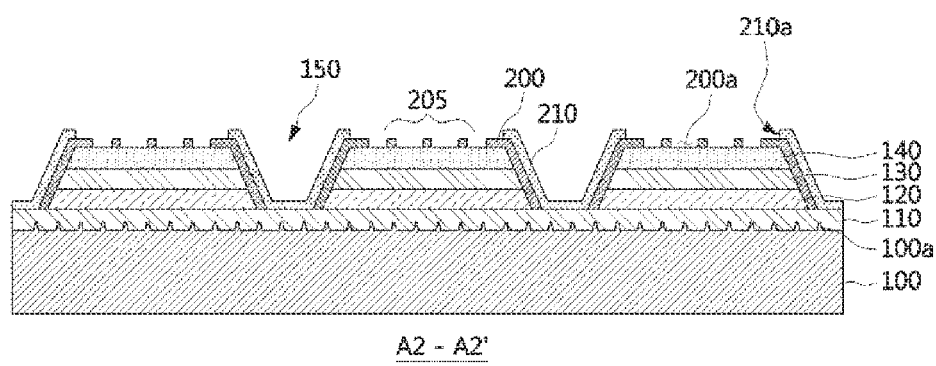
A2 - A2'
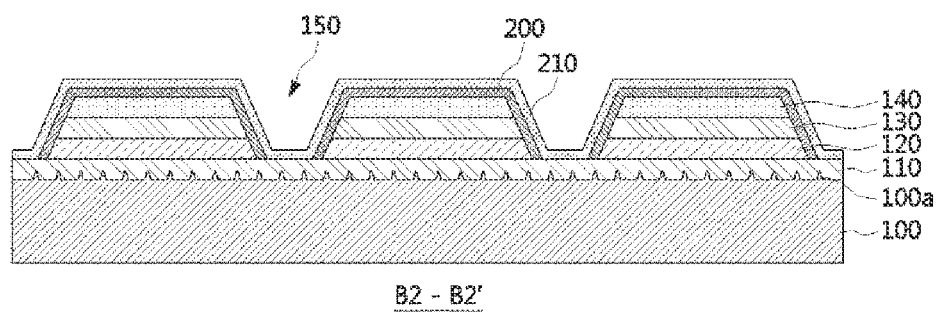
B2 - B2'

A - A'

Fig. 25
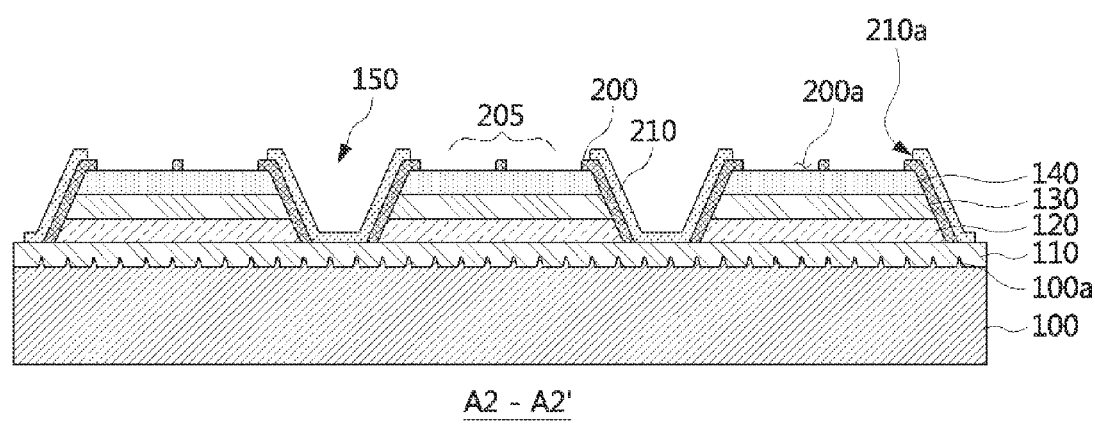
A2 - A2'
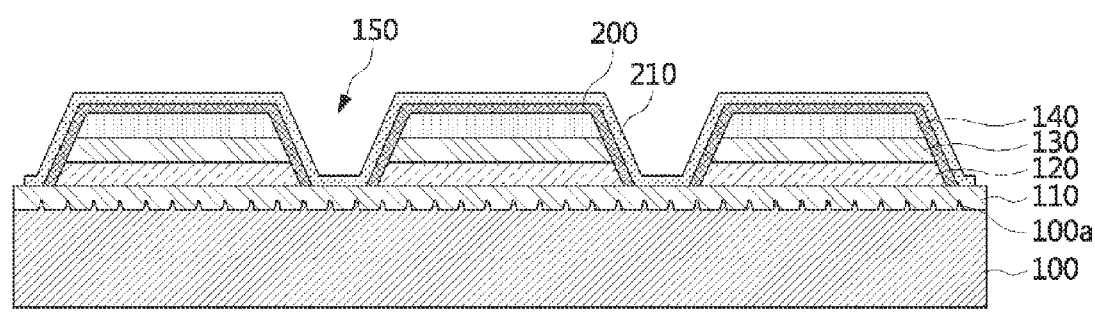
B2 - B2'

Fig. 27
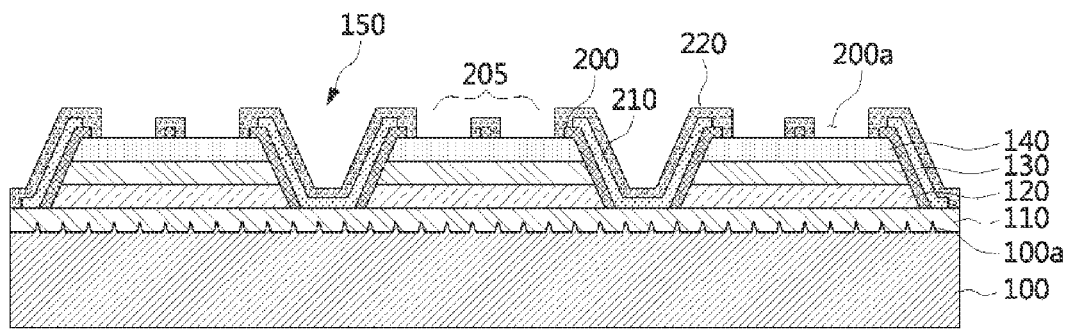
A3 - A3'
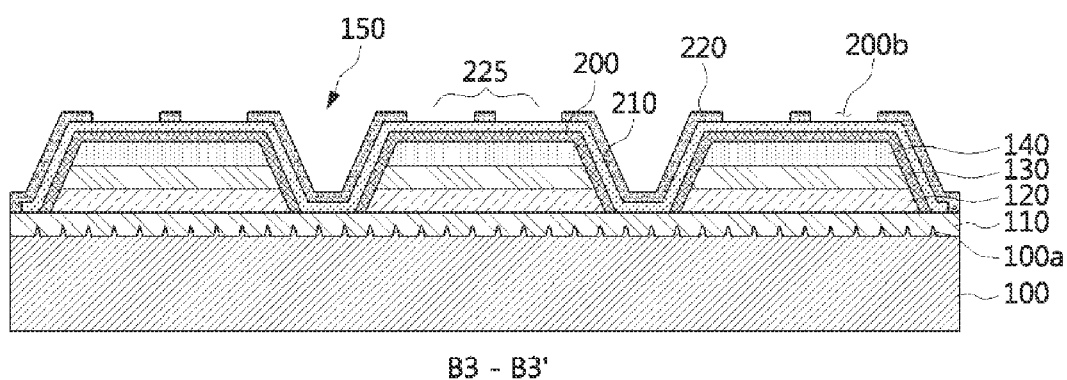
B3 - B3'
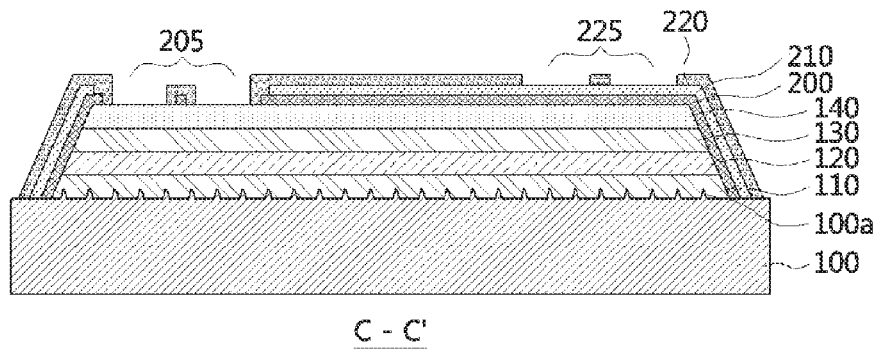
C - C'

LIGHT EMITTING DIODE MODULE FOR SURFACE MOUNT TECHNOLOGY AND METHOD OF MANUFACTURING THE SAME

PRIORITY CLAIMS AND CROSS-REFERENCE TO RELATED APPLICATION

This patent document is a continuation-in-part application under 35 U.S.C. 111(a), 120 and 365(c) and claims priority to, and benefits of prior PCT application number PCT/KR2013/005557 filed on Jun. 24, 2013 which further claims the priority and benefits of prior Korean application number 10-2012-0071576 filed on Jul. 2, 2012. This patent document incorporates by reference the above two patent filings in their entirety.

TECHNICAL FIELD

This patent document relates to a light emitting diode (LED) including a surface-mount LED module and a method of manufacturing the same.

BACKGROUND

A light emitting diode (LED) is a device including an n-type semiconductor layer, a p-type semiconductor layer, and an active layer interposed between the n- and p-type semiconductor layers. When a forward electric field is applied to the n- and p-type semiconductor layers, electrons and holes may be injected into the active layer and recombine in the active layer to emit light.

An LED module including a plurality of LEDs is disclosed in, for example, U.S. Patent Publication No. 2011-0127568. The surface-mount LED module includes a p-type pad and an n-type pad formed on a top surface of an LED. However, since the p-type pad is electrically connected to the entire surface of p-GaN exposed by an insulating layer, current crowding may occur.

In addition, depending on the type of a chip, an LED may include a reflection layer. For example, the type of a flip-chip is characterized by emitting light through a substrate. Accordingly, after a semiconductor layer is formed on the substrate, a reflection layer formed of a metal is introduced on the semiconductor layer or a current spreading layer, and light is reflected by the reflection layer. Also, a barrier layer is provided on the reflection layer. The barrier layer is provided to prevent diffusion of the metal forming the reflection layer.

SUMMARY

Examples of implementations of the technology disclosed in this patent document provide a light emitting diode (LED) module and a method of manufacturing an LED module, which reduces current crowding.

In one implementation, a light emitting diode (LED) module is provided to include: an LED unit having a stacked structure including a first semiconductor layer, an active layer, a second semiconductor layer, and a reflection pattern that are formed over a substrate, and including a mesa region exposing at least a portion of a surface of the first semiconductor layer, a first insulating layer formed over the stacked structure to expose the mesa region, the first insulating layer patterned on the reflection pattern to form a first pad region, a conductive reflection layer formed over the first insulating layer and the first semiconductor layer exposed in the mesa region, a second insulating layer formed over the conductive reflection layer, the second insulating layer patterned on the conductive reflection layer to form a second pad region, a first pad formed over the first pad region, and a second pad formed over the second pad region.

In some implementations, the patterned first insulating layer exposes selective portions of the reflection pattern. In some implementations, the patterned second insulating layer exposes selective portions of the conductive reflection layer. In some implementations, an area of the exposed reflection pattern is greater than an area of the exposed conductive reflection layer. In some implementations, the first and second pad regions include holes and the number of holes in the first pad region is equal to or greater than the number of holes in the second pad region. In some implementations, an area of the first pad is greater than an area of the second pad. In some implementations, when a wavelength of light generated in the active layer is $\lambda$, a thickness of the first insulating layer is an integer multiple of $\lambda/4$. In some implementations, the reflection pattern comprises: a reflective metal layer formed over the second semiconductor layer and configured to reflect light; and a conductive barrier layer configured to cover the reflective metal layer and extend over the second semiconductor layer. In some implementations, the conductive barrier layer has a thickness depending on an underlying layer. In some implementations, a side surface of the reflective metal layer forms an inclined angle of about 5° to about 45° with respect to a surface of the second semiconductor layer.

In another aspect, a method of manufacturing an LED module is provided. The method includes: forming a stacked structure including a first semiconductor layer, an active layer, a second semiconductor layer, and a reflective pattern; forming a first insulating layer over the stacked structure to expose portions of the reflection pattern and portions of the first semiconductor layer, wherein the exposed portions of the reflection pattern and the first insulating layer over the reflection pattern define a first pad region, forming a conductive reflection layer over the first insulating layer to electrically connect with the exposed portions of the first semiconductor layer, and expose the first pad region, forming a second insulating layer over the conductive reflection layer to expose portions of the reflection pattern and portions of the conductive reflection layer, wherein the exposed portions of the conductive reflection layer and the second insulating layer over the conductive reflection layer define a second pad region, and forming a first pad over the first pad region and forming a second pad over the second pad region.

In some implementations, the forming of the stacked structure includes: forming the first semiconductor layer, the active layer, and the second semiconductor layer over the substrate; etching the second semiconductor layer and the active layer to form a mesa region exposing at least a portion of a surface of the first semiconductor layer; forming a photoresist pattern on the mesa region, the photoresist pattern having an overhang structure; forming a reflective metal layer on a surface of the second semiconductor layer exposed by the photoresist pattern; and forming a conductive barrier layer over the reflective metal layer, wherein the conductive barrier layer extends over the surface of the second semiconductor layer.

In some implementations, an area of the reflection pattern exposed through the first pad region is greater than an area of the conductive reflection layer exposed through the second pad region. In some implementations, the forming of the first insulating layer includes forming the first insulating layer on a side surface of the LED module to have a thickness of an integer multiple of $\lambda/4$, when a wavelength of light generated in the active layer is $\lambda$.

In another aspect, a light emitting diode (LED) module is provided to comprise: a stacked structure including a first semiconductor layer, an active layer, a second semiconductor layer, and a reflection pattern that are formed over a substrate; a first pad region formed over the reflection pattern to include a first insulation layer patterned to expose at least a portion of the reflection pattern; a conductive reflection layer formed over the stacked structure; a second pad region formed over the conductive reflection layer to include a second insulation layer patterned to expose at least a portion of the conductive reflection layer; a first pad disposed over the first pad region to electrically connect the first pad region to the second semiconductor layer; and a second pad disposed over the second pad region to electrically connect the second pad region to the first semiconductor layer.

In some implementations, a size of the first pad is greater than a size of the second pad. In some implementations, the first and second pad regions include holes defined by the pattered first and second insulation layers, respectively, and the number of the holes in the first pad region is greater than the number of the holes in the second pad region. In some implementations, the active layer, the second semiconductor layer, and the reflection pattern have an inclined sidewall. In some implementations, the LED module further comprises: a pad barrier layer formed over at least one of the first pad of the second pad. In some implementations, the LED module comprises a phosphor layer disposed over at least one surface of the substrate.

According to some implementations of the disclosed technology, pads are formed on patterned pad regions during a manufacturing process of a light emitting diode (LED) module. Thus, local current crowding can be prevented. Also, in some implementations, diffusion of metals is prevented by providing a reflection barrier layer between a conductive reflection layer and each pad. For example, a phenomenon in which a metal of the conductive reflection layer moves to a second pad to increase the resistivity of the second pad can be prevented. In addition, a second semiconductor layer is electrically connected to a first pad. In some implementations, a pad barrier layer is formed on each of the pads. In this case, the pad barrier layer prevents diffusion of a metal generated during a bonding or soldering process so that the first pad or the second pad can have a high conductivity and be in electrical contact with the outside.

Furthermore, in some implementations, a phosphor layer including a plurality of phosphor layers may be provided on an LED chip. Accordingly, the correction of color coordination is performed using wavelength conversion for at least one wavelength, and the correction of color coordination can be simplified by controlling concentrations of phosphors.

Those and other aspects of the disclosed technology and their implementations and variations are described in greater detail in the drawings, the description and the claims.

BRIEF DESCRIPTION OF DRAWINGS

FIGS. 9 through 18 are plan views and cross-sectional views illustrating a method of manufacturing an LED module including the LED unit of FIG. 3 according to another implementation of the disclosed technology.

FIGS. 20 through 29 are plan views and cross-sectional views illustrating a method of manufacturing an LED module including the LED unit of FIG. 3 according to another implementation of the disclosed technology.

DETAILED DESCRIPTION

Figure 1:
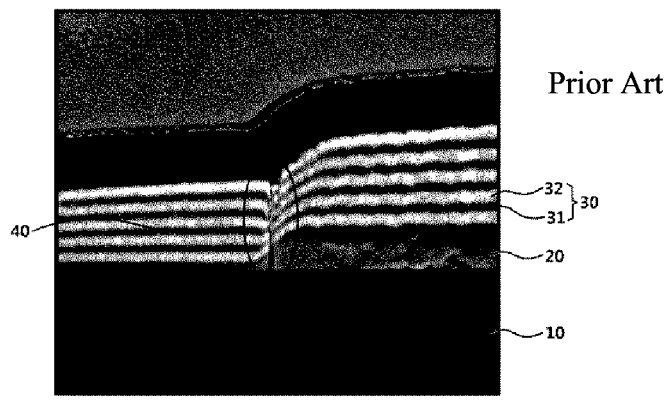
FIG. 1 shows an image of a conventional light emitting diode (LED) including a reflection layer and a barrier layer are introduced.

Hereinafter, exemplary implementations of the disclosed technology will be described in detail. It should be understood, however, that those implementations are provide as examples and there is no intent to limit the disclosed technology to the implementations disclosed.

It will be understood that when a layer is referred to as being "on" another layer or substrate, it can be directly on the other layer or substrate or intervening layers may also be present. Terms that describe spatial relationships, such as "on," "upper," "top surface," "under," "lower," "bottom surface" and the like, may be used herein for ease of description to describe one element or the relationship to another element(s) or feature(s) as illustrated in the figures. It will be understood that such terms are intended to encompass different orientations of the device in use or operation in addition to the orientation(s) depicted in the figures.

Certain terms in this patent document such as first, second, etc. are merely used to provide labels for various elements and the labels do not limit the scope of the labeled elements. These labeling terms are only used to distinguish one element from another element, and the labeling terms do not specify an order or a temporal relationship among the labeled elements.

In the drawings, the thicknesses of layers and regions may be exaggerated for clarity. Like reference numerals refer to like elements throughout.

FIG. 1 shows a conventional LED including a reflection layer and a barrier layer.

A reflection layer 20 is formed on a p-type semiconductor layer 10. The reflection layer 20 is formed through an e-beam evaporation process. The e-beam allows metal ions or atoms to have directionality and, a shape of the reflection layer 20 may be determined by an entrance angle of the metal ions or atoms. A side portion of the reflection layer 20 tend to not have a substantially vertical profile with respect to the p-type semiconductor layer 10 and rather forms a predetermined angle with respect to a surface of the p-type semiconductor layer 10. For example, when the reflection layer 20 includes silver (Ag), it is difficult for the reflection layer 20 to have a vertical profile due to inherent diffusivity. Accordingly, it is general to obtain a nearly vertical profile by controlling an angle of a substrate with respect to a direction in which metal ions or atoms proceed from a target.

A barrier layer 30 is introduced on the reflection layer 20. In FIG. 1, the barrier layer 30 has a structure in which two kinds of metal layers are alternately formed. The barrier layer 30 is provided to prevent diffusion of metal atoms of the reflection layer 20. For example, the barrier layer 30 is formed by alternately stacking a Ti layer and a TiW layer. Alternatively, the barrier layer 30 may be obtained by repetitively forming a single kind of metal layer instead of two kinds of metal layers.

The various conditions including diffusion coefficients and thermal expansion coefficients of a metal of the barrier layer 30 that is stacked during the formation of the barrier layer 30 cause the structure of the barrier layer 30 to be spontaneously destroyed or crack. This problem becomes worse as the underlying reflection layer 20 has a profile closer to a vertical profile.

In FIG. 1, on the reflection layer 20 including Ag, a first barrier layer 31 and a second barrier layer 32 are formed to include Ag and titanium tungsten (TiW), respectively. A side surface of the reflection layer 20 forms an angle at a surface of a p-type semiconductor layer 10 exceeding about 45°. The barrier layer 30 is deposited on a profile having a high inclination. The deposition process is generally performed using a sputtering process.

The first barrier layer 31 and the second barrier layer 32 are alternately stacked along the inclined profile. However, as the number of times the first and second barrier layers 31 and 32 are stacked increases and the thickness of the barrier layer 30 increases, the barrier layer 30 is likely to crack in the inclined side surfaces of the reflection layer 20. The cracks occur more frequently if the barrier layer 32 includes two different kinds of metals that are alternately stacked and as the inclination angle of a side profile of the reflection layer 20 increases. FIG. 1 shows a cracked portion 40.

Figure 2:
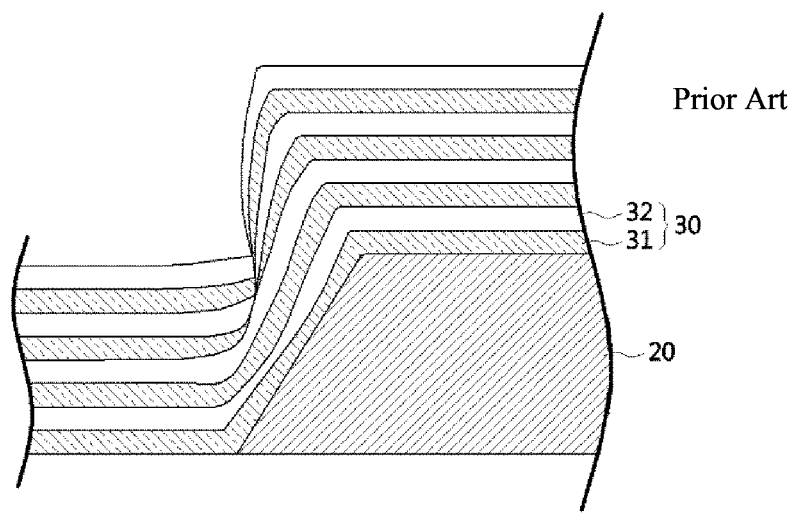
FIG. 2 is a cross-sectional view showing a cracked portion of FIG. 1.

FIG. 2 is a cross-sectional view showing the cracked portion of FIG. 1.

Referring to FIG. 2, as the number of the first barrier layer 31 and the second barrier layer 32 that are alternately formed on side surfaces of the reflection layer 20 increases, the thicknesses of the first and second barrier layers 31 and 32 formed on the side surfaces of the reflection layer 20 decreases, and a phenomenon occurs that the first and second barrier layers 31 and 32 are not any longer deposited on the side surfaces of the reflection layer 20. Accordingly, a portion is formed along the barrier layer 30, in which the first barrier layer 31 or the second barrier layer becomes discontinuous. Thus, a crack occurs in the barrier layer 30. The crack occurred in the barrier layer 30 cause metal atoms of the reflection layer 20 to diffuse. Accordingly, as heterogeneous metals are introduced in a subsequent process including forming an electrode, electrical properties are degraded.

The causes why the crack portion is formed as shown in FIGS. 1 and 2 may be analyzed in various approaches.

For example, the barrier layer 30 may be formed near a top surface of the reflection layer 20 to have a relatively great thickness, while the barrier layer 30 may be formed on side surfaces of the reflection layer 20 to have a relatively small thickness. When this phenomenon continues or worsens, a discontinuous portion is formed in the first barrier layer 31 or the second barrier layer 32.

Furthermore, cracks may occur in a specific barrier layer due to a difference in coefficient of thermal expansion between two kinds of metal materials during the deposition of the two kinds of metal materials. The cracks in the first barrier layer 31 or the second barrier layer 32 are not cured during a subsequent deposition process, and the cracks occur more frequently as a deposition process proceeds. It can be seen from FIG. 1 that a crack or discontinuity is more serious toward an upper portion of the cracked portion 40.

Cracks formed in a barrier layer adversely affect characteristics of an LED. For example, metal atoms may diffuse from a reflection layer, thereby degrading electrical properties. Also, since an LED has a stacked structure of multiple layers, cracks in the barrier layer become worse depending on the environment in which an LED is used. The cracks in the barrier layer fatally affect the reliability of the LED.

Furthermore, when a surface-mount LED module is manufactured using the above described LED with cracks, local crowding of current supplied from a pad occurs due to the cracks in the barrier layer. For instance, even if a high voltage or current is applied to increase luminance, since the current crowds in a p-GaN layer, luminance is reduced.

Figure 3:
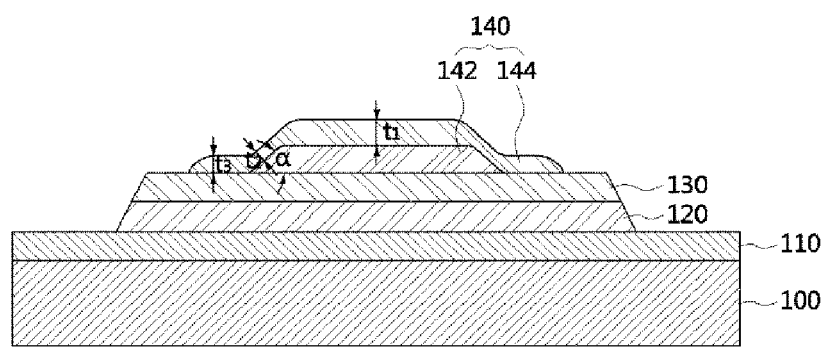
FIG. 3 is a cross-sectional view of an exemplary LED unit according to one implementation of the disclosed technology.

FIG. 3 is a cross-sectional view of an exemplary light emitting diode (LED) unit provided according to one implementation of the disclosed technology.

Referring to FIG. 3, a first semiconductor layer 110, an active layer 120, a second semiconductor layer 130, and a reflection pattern 140 are formed on a substrate 100.

The substrate 100 may be formed of or include any material capable of inducing the first semiconductor layer 110 to be grown. Accordingly, the substrate 100 may include sapphire (Al2O3), silicon carbide (SiC), gallium nitride (GaN), indium gallium nitride (InGaN), aluminum gallium nitride (AlGaN), aluminum nitride (AlN), gallium oxide (Ga2O3), or silicon. In one implementation, the substrate 100 may be or include a sapphire substrate.

Also, the substrate 100 may be or include a substrate on which surface treatment is not performed. The substrate 100 may be patterned. Also, a surface of the substrate 100 may have a moth-eye structure. For example, the substrate 100 may have a protrusion protruding in a roughly hemispherical shape, and pointed structures may be densely disposed on the protrusion.

The first semiconductor layer 110 is formed on the substrate 100. As one example, the first semiconductor layer 110 has an n conductivity type.

The active layer 120 may be formed on the first semiconductor layer 110. The active layer 120 may have a single quantum well (SQW) structure in which a well layer and a barrier layer are stacked, or a multi-quantum well (MQW) structure in which well layers and barrier layers are alternately stacked.

The second semiconductor layer 130 is formed on the active layer 120. As one example, the second semiconductor layer 130 has a p conductivity type.

The first semiconductor layer 110, the active layer 120, and the second semiconductor layer 130 may include Si, GaN, AlN, InGaN, or AlInGaN. When the first semiconductor layer 110 includes GaN, the active layer 120 and the second semiconductor layer 130 include GaN. However, since the second semiconductor layer 130 has a complementary conductivity type to the first semiconductor layer 110, a different dopant from that of the first semiconductor layer 110 is introduced into the second semiconductor layer 130. For example, when a dopant serving as a donor is introduced into the first semiconductor layer 110, a dopant serving as an acceptor is introduced into the second semiconductor layer 130. Also, the active layer 120 may include a material on which bandgap engineering is performed to form a barrier layer and a well layer.

The reflection pattern 140 is formed on the second semiconductor layer 130.

The reflection pattern 140 includes a reflective metal layer 142 and a conductive barrier layer 144. In some implementations, an ohmic contact layer (not shown) may be formed under the reflective metal layer 142, and a stress relaxation layer (not shown) may be formed between the reflective metal layer 142 and the conductive barrier layer 144.

An ohmic contact layer may be formed of or include any material capable of enabling ohmic contact between the reflective metal layer 142 and the second semiconductor layer 130. Accordingly, the ohmic contact layer may include a metal including nickel (Ni) or platinum (Pt) or include a conductive oxide, such as indium tin oxide (ITO) or zinc oxide (ZnO). In some implementations, the ohmic contact layer may be omitted.

If the ohmic contact layer is provided, the reflective metal layer 142 is formed on the ohmic contact layer. The reflective metal layer 142 reflects light generated in the active layer 120. Accordingly, the reflective metal layer 142 is formed with a material having conductivity and high optical reflectance. The reflective metal layer 142 includes silver (Ag), a Ag alloy, aluminum (Al), or an Al alloy.

In some implementations, a stress relaxation layer may be formed on the reflective metal layer 142. The stress relaxation layer may have a coefficient of thermal expansion equal to or higher than that of the conductive barrier layer 144, and equal to or lower than that of the reflective metal layer 142. Thus, stress caused due to a difference in coefficient of thermal expansion between the reflective metal layer 142 and the conductive barrier layer 144 may be reduced. Accordingly, a material used for the stress relaxation layer may be selected depending on materials used for the reflective metal layer 142 and the conductive barrier layer 144.

As discussed above, the ohmic contact layer or the stress relaxation layer may be omitted according to various implementations of the disclosed technology.

An angle α that the reflective metal layer 142 forms with respect to a surface of the underlying second semiconductor layer 130 may range from about 5° to about 45°. When an angle α formed by a side surface of the reflective metal layer 142 is less than about 5°, it is difficult to secure a sufficient thickness of the reflective metal layer 142. When the angle α formed by the side surface of the reflective metal layer 142 is more than about 45°, cracks occur in a side profile of the conductive barrier layer 144 formed on the reflective metal layer 142. When an ohmic contact layer is introduced, an inclination angle that the ohmic contact layer forms with respect to the side surface of the reflective metal layer 142 may have the same range as that between the reflective metal layer 142 and the second semiconductor layer 130.

The conductive barrier layer 144 is formed on the reflective metal layer 142 or the stress relaxation layer 143. For example, when the stress relaxation layer 143 is omitted, the conductive barrier layer 144 is formed on the reflective metal layer 142, and when the stress relaxation layer 143 is formed, the conductive barrier layer 144 is formed on the stress relaxation layer 143. The conductive barrier layer 144 is formed to surround at least the side surface of the reflective metal layer 142 and surround top and side surfaces of the stress relaxation layer 143. Accordingly, diffusion of metal atoms or ions of the reflective metal layer 142 is prevented. Also, stress caused due to a difference in coefficient of thermal expansion between the conductive barrier layer 144 and the reflective metal layer 142 may be absorbed in the stress relaxation layer 143. In particular, the conductive barrier layer 144 may be formed to have a different thickness depending on a surface state of the underlying layer that may be the reflective metal layer 142 or stress relaxation layer 143. For example, assuming that the thickness of the conductive barrier layer 144 formed on a top surface of the reflective metal layer 142 or the stress relaxation layer 143 is t1, the thickness of the conductive barrier layer 144 formed on the side surface of the reflective metal layer 142 is t2, and the thickness of the conductive barrier layer 144 formed on the surface of the second semiconductor layer 130 is t3, a relationship of t1>t3>t2 is set.

In addition, the conductive barrier layer 144 is formed to completely shield or cover the uppermost layer of the reflection pattern 140, for example, the reflective metal layer 142 or the stress relaxation layer 143, and extend to the surface of the second semiconductor layer 130.

In addition, when the reflective metal layer 142 includes Al or an Al alloy, and the conductive barrier layer 144 includes W, TiW, or Mo, the stress relaxation layer 143 may be a single layer formed of or including Ag, Cu, Ni, Pt, Ti, Rh, Pd, or Cr, or a combination formed of or including Cu, Ni, Pt, Ti, Rh, Pd or Au. Also, when the reflective metal layer 142 includes Al or an Al alloy, and the conductive barrier layer 144 includes Cr, Pt, Rh, Pd, or Ni, the stress relaxation layer 143 may be a single layer formed of or including Ag or Cu, or a combination formed of or including Ni, Au, Cu, or Ag.

Furthermore, when the reflective metal layer 142 includes Ag or a Ag alloy, and the conductive barrier layer 144 includes W, TiW, or Mo, the stress relaxation layer 143 may be a single layer formed of or including Cu, Ni, Pt, Ti, Rh, Pd, or Cr, or a combination formed of or including Cu, Ni, Pt, Ti, Rh, Pd, Cr, or Au. Also, when the reflective metal layer 142 includes Ag or a Ag alloy, and the conductive barrier layer 144 includes Cr or Ni, the stress relaxation layer 143 may be a single layer formed of or including Cu, Cr, Rh, Pd, TiW, or Ti, or a combination formed of or including Ni, Au, or Cu.

In addition, the conductive barrier layer 144 extends over the surface of the second semiconductor layer 130.

FIGS. 4 through 8 are cross-sectional views illustrating an exemplary method of manufacturing the LED unit of FIG. 3 according to one implementation of the disclosed technology.

Figure 4:
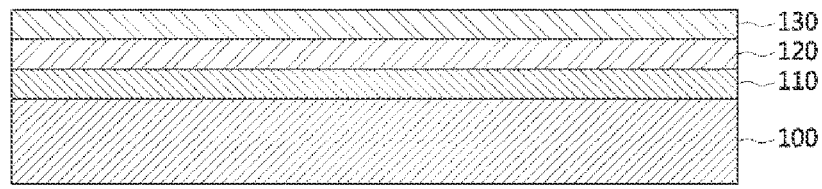
FIGS. 4 through 8 are cross-sectional views illustrating an exemplary method of manufacturing the LED unit of FIG. 3 according to one implementation of the disclosed technology.

Referring to FIG. 4, a first semiconductor layer 110, an active layer 120, and a second semiconductor layer 130 are sequentially formed on a substrate 100.

The substrate 100 may include sapphire (Al2O3), silicon carbide (SiC), gallium nitride (GaN), indium gallium nitride (InGaN), aluminum gallium nitride (AlGaN), aluminum nitride (AlN), gallium oxide (Ga2O3), or silicon. In one implementation, the substrate 100 may be a sapphire substrate. Also, the substrate 100 may be patterned or have a surface with a moth-eye structure.

The first semiconductor layer 110 is provided on the substrate 100. As one example, the first semiconductor layer 110 has an n conductivity type.

In addition, the active layer 120 formed on the first semiconductor layer 110 may have an SQW structure in which a well layer and a barrier layer are stacked, or an MQW structure in which well layers and barrier layers are alternately stacked.

The second semiconductor layer 130 is provided on the active layer 120. As one example, the second semiconductor layer 130 has a p conductivity type.

Materials and structures of the first semiconductor layer 110, the active layer 120, and the second semiconductor layer 130 are the same as those described with reference to FIG. 3, and thus detailed descriptions are omitted.

In addition, the first semiconductor layer 110, the active layer 120, and the second semiconductor layer 130 are formed using an epitaxial growth process. Accordingly, the first semiconductor layer 110, the active layer 120, and the second semiconductor layer 130 may be formed using an MOCVD process.

Figure 5:
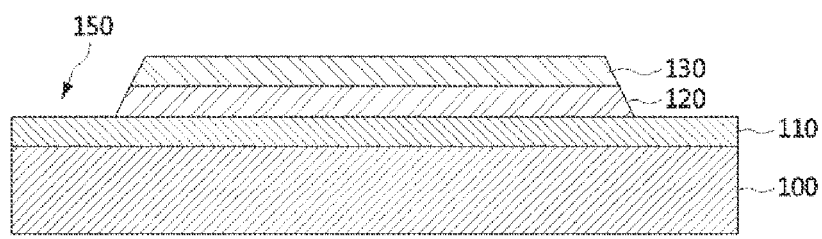

Referring to FIG. 5, portions of the active layer 120 and the second semiconductor layer 130 are removed using an etching process. Thus, portions of the first semiconductor layer 110 are exposed. In one implementation, after the etching process, selective portions of a top surface of the first semiconductor layer 110 are exposed, and side surfaces of the active layer 120 and the second semiconductor layer 130 are exposed. Through the etching process of removing portions of the active layer 120 and the second semiconductor layer 130, a trench or a hole may be formed. A mesa region 150 is formed in FIG. 5 by etching from the surface of the second semiconductor layer 130 to the surface of the first semiconductor layer 110. The mesa region 150 may be or include a stripe type having a trench shape or a hole type.

When the mesa region 150 has the stripe type, the mesa region 150 may have a vertical profile or inclined profile with respect to the surface of the first semiconductor layer 110. In one implementation, the mesa region 150 has a profile inclined at an angle of about 20° to about 70° with respect to the surface of the first semiconductor layer 110. When the mesa region 150 has a hole type having a roughly circular shape, the mesa region 150 may have a vertical profile or inclined profile with respect to the surface of the first semiconductor layer 110. In one implementation, the mesa region 150 has a profile inclined at an angle of about 20° to about 70° with respect to the surface of the first semiconductor layer 110. If the mesa region 150 is inclined at an angle of less than 20°, the mesa region 150 has a greatly increased width in the upper portion of the mesa region 150. In this case, since the structure of the mesa region 150 allows the generated light to emit, convergence of the generated light is degraded. If the mesa region 150 is inclined at an angle of more than 70°, the mesa region 150 has a nearly vertical profile. In this case, the sidewalls of layers do not effectively reflect the generated light as compared to the inclined sidewalls.

Figure 6:
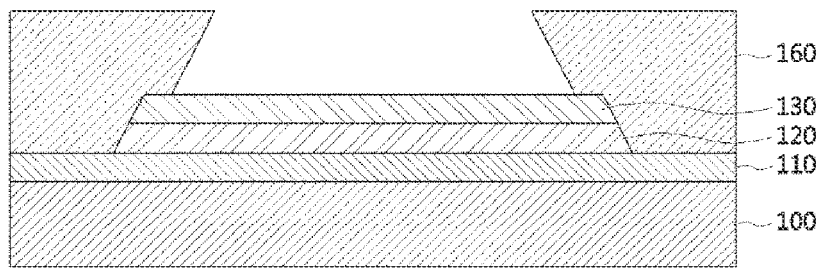

Referring to FIG. 6, a photoresist pattern 160 is formed on the exposed portion of the first semiconductor layer 110, which form a bottom surface of the mesa region. The photoresist pattern 160 may have a vertical profile with respect to the surface of the first semiconductor layer 110. In some implementations, the photoresist pattern 160 may be formed to have an overhang structure having a bottom surface with a smaller width than a top surface thereof. In one implementation, the photoresist pattern 160 may have a negative type. Accordingly, exposed portions are cross-linked. To form the overhang structure, the photoresist pattern 160 is exposed while being inclined at a predetermined angle. In the case of the overhang structure, a distance between bottom surfaces of the photoresist patterns 160 may be greater than or equal to a distance between top surfaces of the photoresist patterns 160. In one implementation, the difference between the distances on the bottom and top surfaces of the photoresist patterns 160 may be at least about 1 μm.

Furthermore, the photoresist pattern 160 may be provided to cover a portion of the surface of the second semiconductor layer 130. Accordingly, the portion of the top surface of the second semiconductor layer 130 may remain shielded or covered by the photoresist pattern 160.

Figure 7:
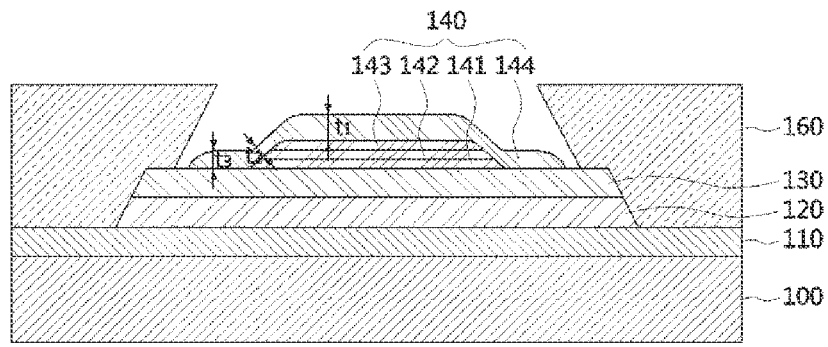

Next, a reflection pattern 140 is formed to include a reflective metal layer 142 and a conductive barrier layer 144 that are sequentially stacked on the second semiconductor layer 130. As discussed above, in some implementations, an ohmic contact layer 141 may be formed under the reflective metal layer 142, and a stress relaxation layer 143 may be formed between the reflective metal layer 142 and the conductive barrier layer 144. In FIG. 7, as one example, the reflection pattern 140 is shown to include the ohmic contact layer 141, the reflective metal layer 142, the stress relaxation layer 143 and the conductive barrier layer 144.

The reflective metal layer 142 includes Al, an Al alloy, Ag, or a Ag alloy. The reflective metal layer 142 may be formed using a metal deposition process. In one implementation, the reflective metal layer 142 is formed using an electronic beam (e-beam) evaporation process capable of moving most metal atoms or ions onto the surface of the second semiconductor layer 130 in a vertical direction. Thus, the metal atoms or ions which have anisotropic etching characteristics may enter a space between the photoresist patterns 160 to form the reflective metal layer 142.

In some implementations, the reflective metal layer 142 has a thickness of about 100 nm to about 1 μm. When the reflective metal layer 142 has a thickness of less than about 100 nm, light generated in the active layer 120 is not smoothly reflected. Also, when the reflective metal layer 142 has a thickness of more than about 1 μm, process loss may occur due to an excessive process time.

In some implementations, if the ohmic contact layer 141 is provided, the ohmic contact layer 141 may be formed before forming the reflective metal layer 142. The ohmic contact layer 141 may include Ni, Pt, ITO, or ZnO. In one implementation, the ohmic contact layer 141 may be formed to have a thickness of about 0.1 nm to about 20 nm. When the ohmic contact layer 141 has a thickness of less than about 0.1 nm, sufficient ohmic characteristics cannot be ensured due to a very small thickness. When the ohmic contact layer 141 has a thickness of more than about 20 nm, the amount of light transmitted is reduced, and the amount of light reflected by the reflective metal layer 142 is reduced.

In some implementations, the stress relaxation layer 143 is formed on the reflective metal layer 142.

In this case, the stress relaxation layer 143 may be formed using a metal deposition process. In one implementation, the stress relaxation layer 143 may be formed using an e-beam evaporation method having high directionality during a deposition process. That is, metal atoms or ions evaporated by e-beams may have directionality and anisotropy in a space between the photoresist patterns 160. In one implementation, the stress relaxation layer 143 may be formed of or include a metal layer. Also, the stress relaxation layer 143 may have a thermal expansion coefficient that is lower than the reflective metal layer 142 and higher than the conductive barrier layer 144 of FIG. 3. Accordingly, a material of the stress relaxation layer 143 may be selected depending on materials of the reflective metal layer 142 and the conductive barrier layer 144.

When the reflective metal layer 142 and the stress relaxation layer 143 are formed using an e-beam evaporation method, a side surface of the reflective metal layer 142 and a side surface of the stress relaxation layer 143 are exposed. In some implementations, the reflective metal layer 142 and the stress relaxation layer 143 corresponding to an open upper region of the photoresist pattern 160 are formed using an anisotropic deposition process.

In an e-beam evaporation process, upper layers formed by the e-beam evaporation process are formed along a profile of a side surface of the stress relaxation layer 143 such that the upper layers are provided to cover or shield underlying layers. In one implementation, a side surface of a structure including the stress relaxation layer 143 or the reflective metal layer 142, which is formed using the e-beam evaporation process, is inclined at an angle α of about 5° to about 45°.

FIG. 7 illustrates a state in which a metal is not formed on the photoresist pattern 160 during the formation of the reflective metal layer 142 and the stress relaxation layer 143.

Next, a conductive barrier layer 144 is formed through the opened region of the photoresist pattern 160.

The conductive barrier layer 144 includes W, TiW, Mo, Cr, Ni, Pt, Rh, Pd, or Ti. A material of the conductive barrier layer 144 may vary depending on materials of the reflective metal layer 142 or the stress relaxation layer 143.

The conductive barrier layer 144 is formed on the stress relaxation layer 143 and shields side surfaces of the reflective metal layer 142 or the stress relaxation layer 143. Accordingly, a metal of the reflective metal layer 142 is prevented from diffusing into the second semiconductor layer 130 through lateral diffusion. The formation of the conductive barrier layer 144 is performed using a metal deposition process. In one implementation, the conductive barrier layer 144 is formed using an isotropic etching process. This is because the conductive barrier layer 144 is configured to surround the side surfaces of the stress relaxation layer 143 and the reflective metal layer 142. For example, the conductive barrier layer 144 may be formed using a sputtering process.

In one implementation, the conductive barrier layer 144 may be a single layer with a thickness of about 100 nm or more and including a specific metal. In another implementation, the conductive barrier layer 144 may include at least two metal materials that are alternately stacked, each metal material forming a layer of the conductive barrier layer 144 to have a thickness of about 20 nm or more. For example, the conductive barrier layer 144 may be formed by alternately depositing a TiW layer having a thickness of about 50 nm and a Ni layer or Ti layer having a thickness of about 50 nm.

The conductive barrier layer 144 has a different thickness according to various conditions of the underlying layer including a state or gradient of an underlying layer. The conductive barrier layer 144 is formed to extend to an upper portion of the second semiconductor layer 130. Since a gradient a of a side surface of the underlying layer has an angle of about 45° or less, occurrence of cracks that is caused by the sharp gradient is prevented in the conductive barrier layer 144.

In some implementations, a Ni/Au/Ti layer may be additionally formed on the conductive barrier layer 144 to enable stable contact of the conductive barrier layer 144 with a material during a subsequent process.

As described above, a material of the stress relaxation layer 143 may be selected according to the materials of the reflective metal layer 142 and the conductive barrier layer 144. This is because a coefficient of thermal expansion of the stress relaxation layer 143 is higher than that of the conductive barrier layer 144 and lower than that of the reflective metal layer 142. Accordingly, when the reflective metal layer 142 includes Al or an Al alloy, and the conductive barrier layer 144 includes W, TiW, or Mo, the stress relaxation layer 143 may be a single layer formed of or including Ag, Cu, Ni, Pt, Ti, Rh, Pd, or Cr, or a combination formed of or including Cu, Ni, Pt, Ti, Rh, Pd or Au. Also, when the reflective metal layer 142 includes Al or an Al alloy, and the conductive barrier layer 144 includes Ti, Cr, Pt, Rh, Pd, or Ni, the stress relaxation layer 143 may be a single layer formed of or including Ag or Cu, or a combination formed of or including Ni, Au, Cu, or Ag. Furthermore, when the reflective metal layer 142 includes Ag or a Ag alloy, and the conductive barrier layer 144 includes W, TiW, or Mo, the stress relaxation layer 143 may be a single layer formed of or including Cu, Ni, Pt, Ti, Rh, Pd, or Cr, or a combination formed of or including Cu, Ni, Pt, Ti, Rh, Pd, Cr, or Au. Also, when the reflective metal layer 142 includes Ag or a Ag alloy, and the conductive barrier layer 144 includes Pt or Ni, the stress relaxation layer 143 may be a single layer formed of or including Cu, Cr, Rh, Pd, TiW, or Ti, or a combination formed of or including Ni, Au, or Cu.

Figure 8:
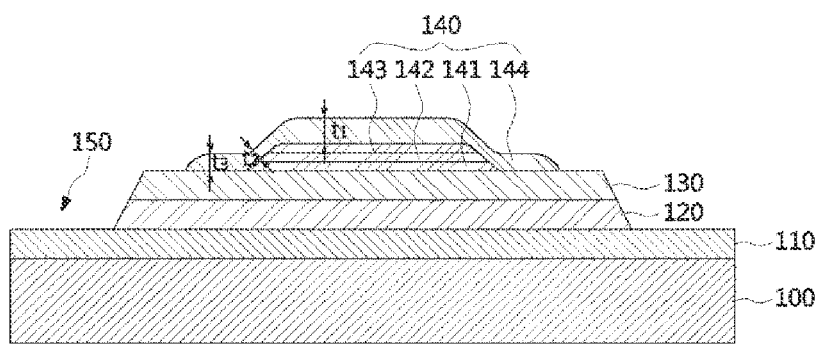

Referring to FIG. 8, the photoresist pattern 160 is removed. Accordingly, the second semiconductor layer 130 and the reflection pattern 140 are exposed. For example, edge portions of the second semiconductor layer 130 and the reflection pattern 140 disposed between the edge portions of the second semiconductor layer 130 are exposed. Also, the mesa region 150 is exposed by removing the photoresist pattern 160. This is the same as described with reference to FIG. 3.

Due to the above-described processes, the reflection pattern 140 is formed on the second semiconductor layer 130. The reflection pattern 140 includes a reflective metal layer 142, a stress relaxation layer 143, and a conductive barrier layer 144. The stress relaxation layer 143 has a lower coefficient of thermal expansion than the reflective metal layer 142 and a higher coefficient of thermal expansion than the conductive barrier layer 144. Accordingly, stress caused due to a difference in coefficient of thermal expansion between the reflective metal layer 142 and the conductive barrier layer 144 is absorbed in the stress relaxation layer 143. As discussed above, the stress relaxation layer 143 can be omitted in some implementations.

In addition, the conductive barrier layer 144, which is formed on the reflective metal layer 142 or the stress relaxation layer 143, has a different thickness according to various properties of the underlying layer including the shape and type of the underlying layer. For example, a thickness t1 of the conductive barrier layer 144 formed on the surface of the reflective metal layer 142 or the stress relaxation layer 143 is greater than a thickness t3 of the conductive barrier layer 144 formed on the surface of the second semiconductor layer 130. Also, the thickness t3 formed on the second semiconductor layer 130 is greater than a thickness t2 of the conductive barrier layer 144 formed on side surfaces of the reflective metal layer 142 or the stress relaxation layer 143.

The above difference in thickness is obtained by performing an isotropic deposition process after forming a photoresist pattern having an overhang structure. That is, deposition is performed to the highest extent on a top surface of the reflective metal layer 142 or stress relaxation layer 144, which is exposed by the photoresist pattern, and deposition may be performed to a relatively high extent on a surface of the second semiconductor layer 130 because the second semiconductor layer 130 has a planar structure. In contrast, since a side surface of the reflective metal layer 142 or the stress relaxation layer 143 has a predetermined inclination and a metal to be deposited should be adhered to sidewalls of the reflective metal layer 142 or the stress relaxation layer 143, the deposition is performed to a relatively low extent on the side surface of the reflective metal layer 142 or the stress relaxation layer 143.

Furthermore, the side surface of the reflective metal layer 142 or the stress relaxation layer 143 is inclined at an angle α of about 5° to about 45°. A required inclination angle may be formed by controlling an angle of a substrate during an e-beam evaporation process. For example, by orienting the substrate at a predetermined angle with respect to an imaginary direction in which metal ions or particles are predicted to proceed, the inclination angle α of the side surface of the reflective metal layer 142 or the stress relaxation layer 143 may be controlled. By setting the inclination angle α of the side surface, occurrence of cracks can be prevented in a conductive barrier layer 144 during a subsequent process.

FIGS. 9 through 18 are plan views and cross-sectional views illustrating an exemplary method of manufacturing an LED module according to another implementation of the disclosed technology.

Figure 9:
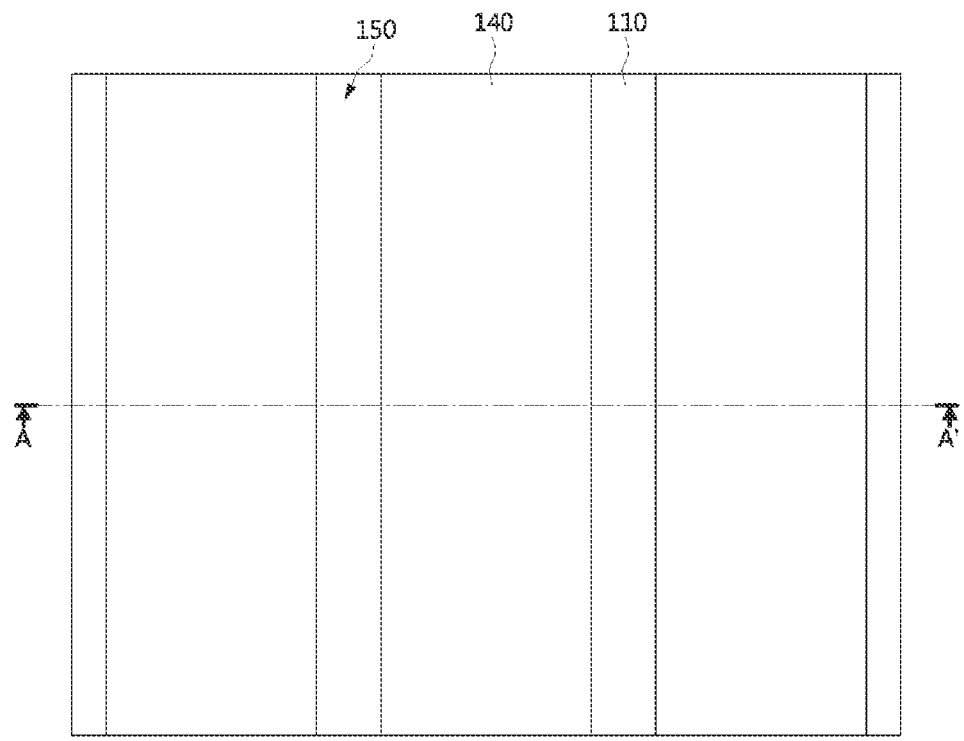
Figure 10:
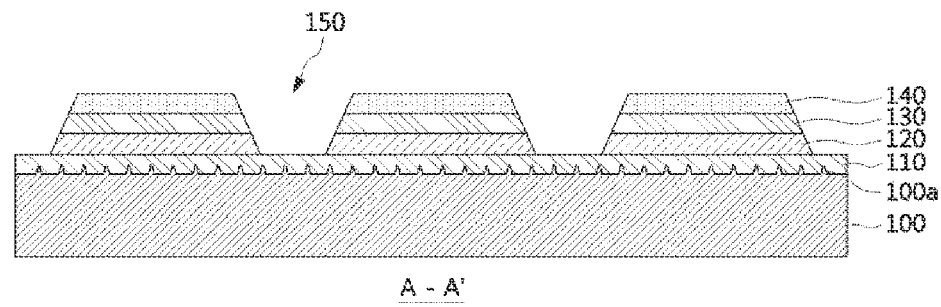

FIG. 9 shows a plan view illustrating an exemplary method of manufacturing an LED module and FIG. 10 shows a cross-sectional view taken along the line A-A' of FIG. 9.

As explained above, a first semiconductor layer 110, an active layer 120, and a second semiconductor layer 130 are sequentially stacked on a substrate 100, and a mesa region 150 is formed using an etching process. A portion of a surface of the first semiconductor layer 110 is exposed through the mesa region 150. Also, a reflection pattern 140 is formed on the second semiconductor layer 130.

In the drawings of the present implementation, the reflection pattern 140 is exaggerated for brevity. In one implementation, the reflection pattern 140 may be formed in the same manner as described with regard to FIGS. 4 through 8. In another implementation, the reflection pattern 140 may be formed using other different techniques.

In some implementations, the substrate 100 may be a substrate on which surface treatment is not performed, or a patterned substrate. Also, a surface of the substrate 100 may have a moth-eye structure. For example, pointed structures 100a may be densely disposed on the surface of the substrate 100. Alternatively, the substrate 100 may have a protrusion protruding in a roughly hemispherical shape, and pointed structures may be densely disposed on the protrusion.

Figure 11:
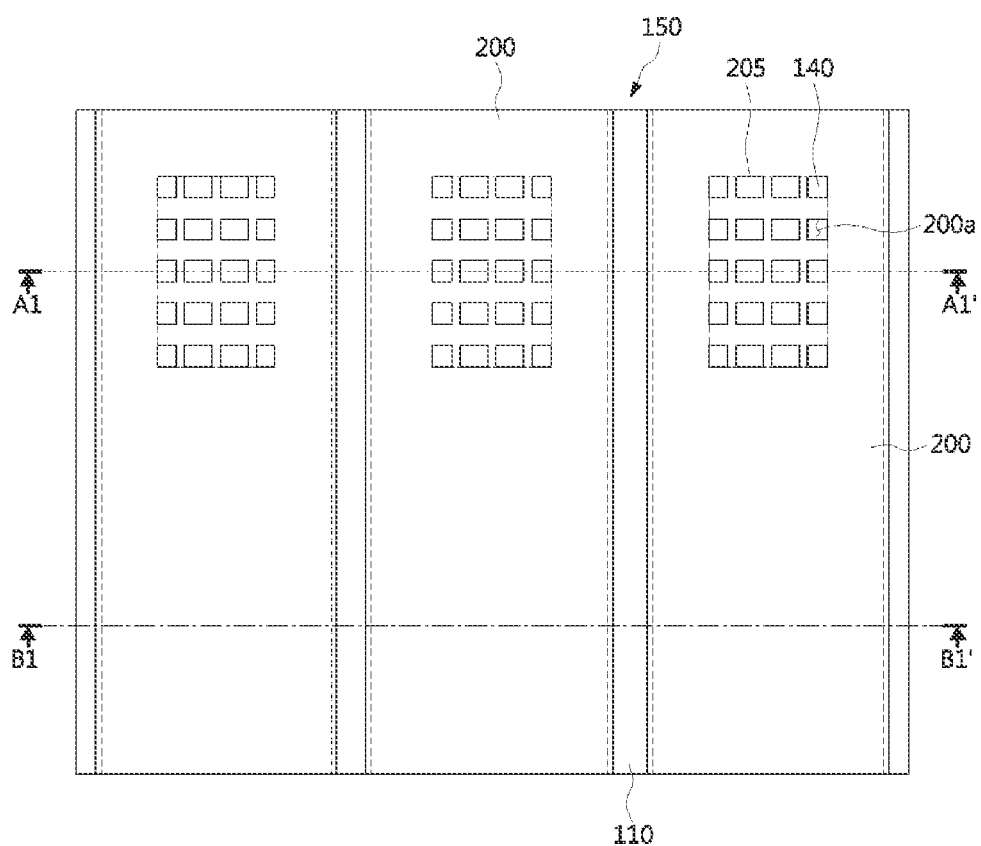

Referring to FIGS. 11 and 12, a first insulating layer 200 is formed on the resultant structure of FIG. 9. The first insulating layer 200 may be formed of or include a transparent nonconductor. In one implementation, silicon oxide may be used as the first insulating layer 200. The first insulating layer 200 is patterned using a photoresist process. By patterning the first insulating layer 200, the first semiconductor layer 110 formed in the mesa region 150 is exposed, and selective portions of the reflection pattern 140 are exposed. A first pad region 205 is defined to include the exposed selective portions of the reflection pattern 140 and the patterned first insulating layer 200 formed on the reflection pattern 140.

FIG. 11 shows a plan view illustrating an exemplary method of manufacturing an LED module and FIG. 12 shows cross-sectional views taken along the line A1-A1' and the line B1-B1' of FIG. 11.

Referring to the cross-sectional view taken along the direction A1-A1', the first insulating layer 200 has a patterned shape on the reflection pattern 140 to expose selective portions of the reflection pattern 140. Also, the first insulating layer 200 is not formed in the mesa region 150 to expose the first semiconductor layer 110. In one implementation, the reflection pattern 140 exposed by the first insulating layer 200 in the first pad region 205 may be provided in the form of a hole 200a as shown in FIG. 12. However, other implementations are also possible such that the reflection pattern 140 exposed by the first insulating layer 200 in the first pad region 205 may be or include a stripe form.

Referring to the cross-sectional view taken along the direction B1-B1', the first insulating layer 200 completely shields or covers the reflection pattern 140. The first semiconductor layer 110 is exposed in the mesa region 150.

Referring to FIGS. 13 and 14, a conductive reflection layer 210 is formed.

Referring to FIG. 13, the conductive reflection layer 210 is coated on the entire surface of the resultant structure of FIG. 11 except an opening 210a. The first pad region 205 is exposed within the opening 210a. Also, the conductive reflection layer 210 is formed in the mesa region 150 and electrically connected to the first semiconductor layer 110.

FIG. 13 shows a plan view illustrating an exemplary method of manufacturing an LED module and FIG. 14 shows cross-sectional views taken along the line A2-A2' and the line B2-B2' of FIG. 13.

Referring to the cross-sectional view taken along the line A2-A2', the conductive reflection layer 210 is formed on the first insulating layer 200 and the exposed first semiconductor layer 110.

Accordingly, the conductive reflection layer 210 is coated on the entire surface except the first pad region 205. Also, the conductive reflection layer 210 is formed on the first semiconductor layer 110 exposed in the mesa region 150 and electrically connected to the first semiconductor layer 110.

The conductive reflection layer 210 is formed of or includes a conductive material. The conductive reflection layer 210 may include Al. Accordingly, the first semiconductor layer 110 and the conductive reflection layer 210 are electrically connected, and the reflection pattern 140 is electrically insulated from the conductive reflection layer 210 by the first insulating layer 200.

In addition, a reflection barrier layer (not shown) may be formed on the conductive reflection layer 210. The reflection barrier layer prevents diffusion of a metal of the conductive reflection layer 210. In one implementation, the reflection barrier layer may be a single layer formed of or including Ni, Cr, or Au, or a combination thereof. In another implementation, the reflection barrier layer is a combined layer formed of or including Ti/Al/Ti/Ni/Au. Also, an adhesive layer (not shown) may be further provided under the conductive reflection layer 210. The adhesive layer may include Ti, Cr, or Ni.

The conductive reflection layer 210 may be formed by stacking the conductive reflection layer 210 and patterning the conductive reflection layer 210 using an etching process. Alternatively, the conductive reflection layer 210 may be formed using a lift-off process. That is, photoresist is coated on the first pad region 205 in which selective portions of the reflection pattern 140 are exposed, and the conductive reflection layer 210 is formed using a deposition process. Then, by removing the photoresist from the first pad region 205, the conductive reflection layer 210 is formed to expose the first pad region 205.

Figure 15:
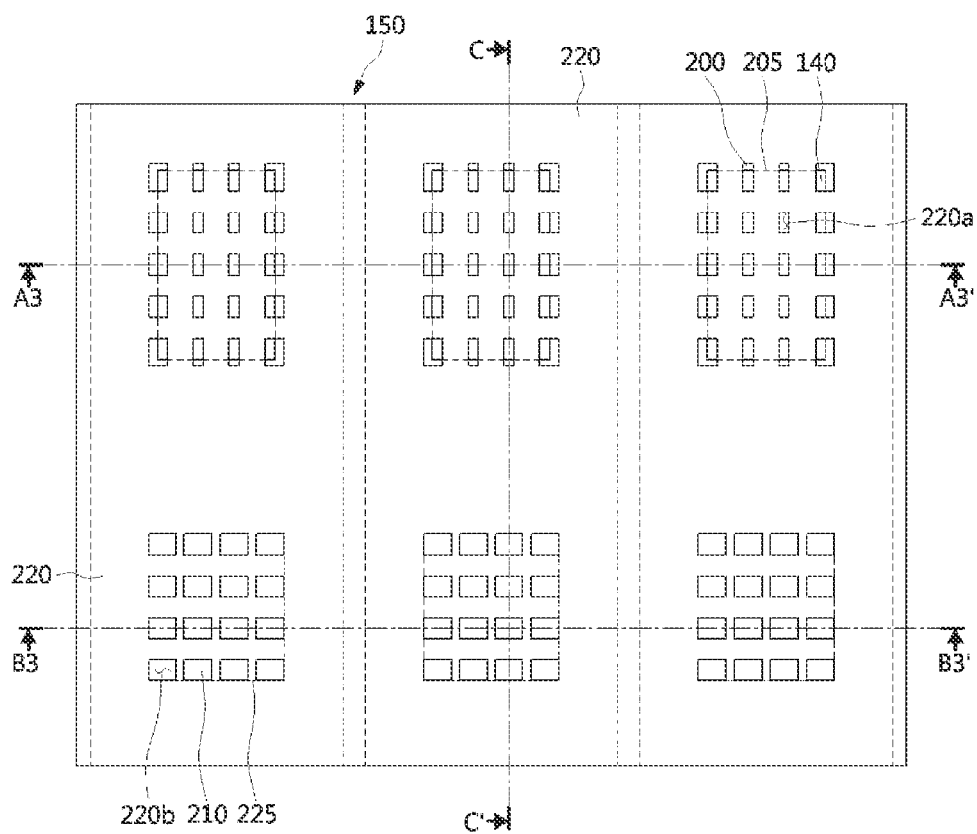
Figure 16:
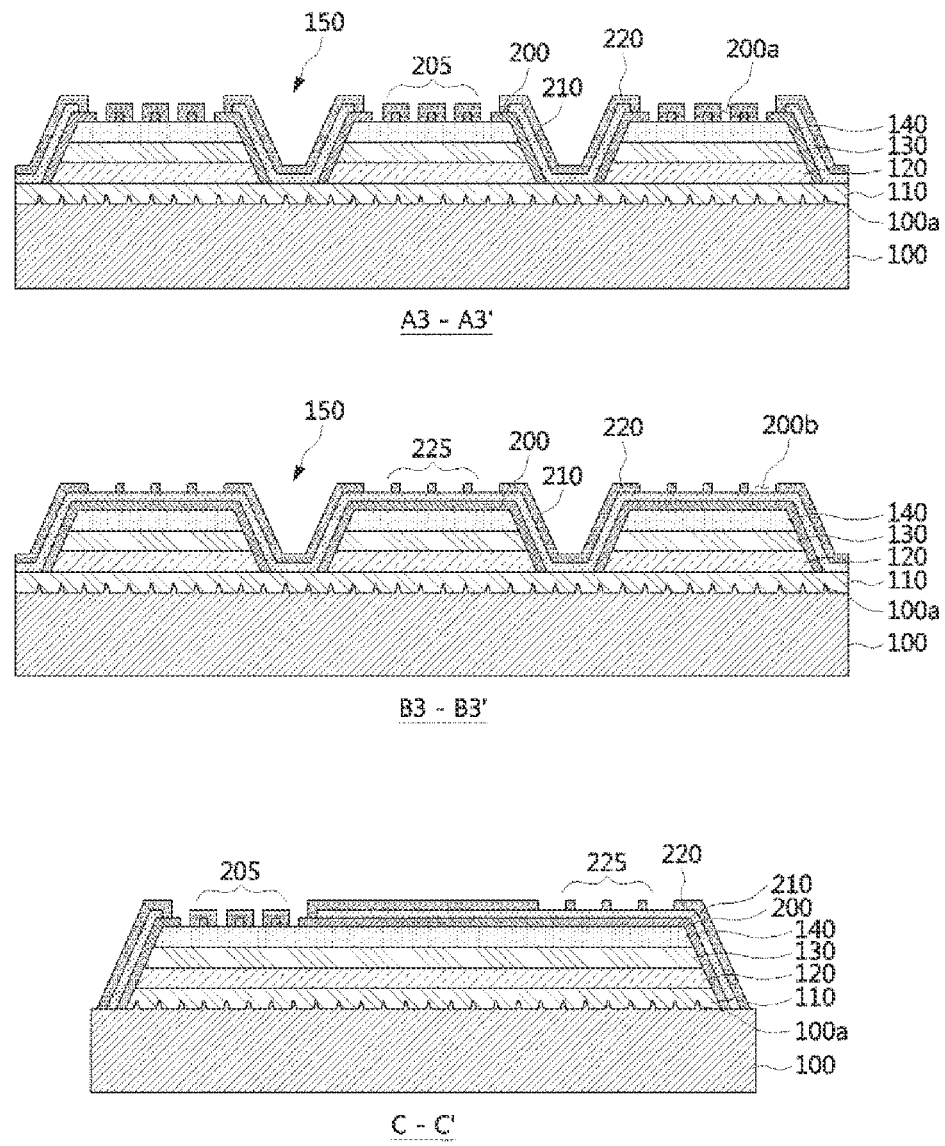

Referring to FIGS. 15 and 16, a second insulating layer 220 is formed on the resultant structure of FIG. 13.

Referring to a plan view of FIG. 15, the second insulating layer 220 includes first holes 220a and second holes 220b. The first holes 220a are formed in the first pad region 205, and a second pad region 225 is defined by the second holes 220b to be under the first pad region 225. Selective portions of the conductive reflection layer 210 are exposed by the second holes 220b formed in the second pad region 225. When a reflection barrier layer is formed on the conductive reflection layer 210, selective portions of the reflection barrier layer may be exposed by the second holes 220b formed in the second pad region 225.

In FIG. 15, the number of first holes 220a may be equal to or greater than the number of second holes 220b. This facilitates diffusion of current through the reflection pattern 140 exposed by the first holes 220a. When the second semiconductor layer 130 is or includes a p-type semiconductor layer, current division into the p-type semiconductor layer becomes a problem in applying current. Accordingly, by controlling the number of first holes 220a to be equal to or greater than the number of second holes 220b, current can be smoothly divided into the second semiconductor layer 130.

This will be clearly described with reference to a cross-sectional view of FIG. 16.

FIG. 15 shows a plan view illustrating an exemplary method of manufacturing an LED module and FIG. 16 shows cross-sectional views taken along lines A3-A3', B3-B3', and C-C' of FIG. 15.

The line A3-A3' crosses the first pad region 205, and the second insulating layer 220 is formed on the conductive reflection layer 210 in the cross-sectional view taken along the line A3-A3'. When a reflection barrier layer is formed on the conductive reflection layer 210, the second insulating layer 220 is formed on the reflection barrier layer. The second insulating layer 220 has the first holes 220a in the first pad region 205, and is also formed on the mesa region 150. In some implementations, the second insulating layer 220 may be formed on the first insulating layer 200 formed on the first pad region 205. In other implementations, the second insulating layer 220 may be not formed on the first insulating layer 200 disposed in the first pad region 205.

Also, the line B3-B3' crosses the second pad region 225, and the second insulating layer 220 is formed on the conductive reflection layer 210 disposed on the mesa region 150 in the cross-sectional view taken along the line B3-B3'. In addition, the second insulating layer 220 is formed to expose selective portions of the conductive reflection layer 210 formed on the reflection pattern 140 except the mesa region 150. That is, the second insulating layer 220 is provided in a patterned shape on the conductive reflection layer 210 disposed on the reflection pattern 140. Accordingly, the selective portions of the conductive reflection layer 210 are exposed to define the second pad region 225. The second pad region 225 includes the exposed selected portion of the conductive reflection layer 210 and the patterned second insulating layer 220 formed on the conductive reflection layer 210. In some implementations, the portion of the conductive reflection layer 210 may be also exposed on the mesa region 150. Furthermore, the second insulating layer 220 in the second pad region 225 may expose the conductive reflection layer 210 such that the exposed conductive reflection layer 210 forms in the shape of the second holes 220b or in a stripe form.

The line C-C' crosses the first pad region 205 and the second pad region 225, and the second insulating layer 220 is formed on the conductive reflection layer 210 in the cross-sectional view taken along the line C-C'. The second insulating layer 220 exposes selective portions of the underlying reflection pattern 140 in the first pad region 205, and shields or covers the conductive reflection layer 210 between the first and second pad regions 205 and 225. Also, the second insulating layer 220 is provided in a patterned shape in the second pad region 225 to expose the underlying conductive reflection layer 210.

The second insulating layer 220 may be formed of or include any insulating material. In some implementations, an oxide-based insulating material, a nitride-based insulating material, a polymer (e.g., polyimide, Teflon, or parylene) may be used for the second insulating layer 220.

Figure 17:
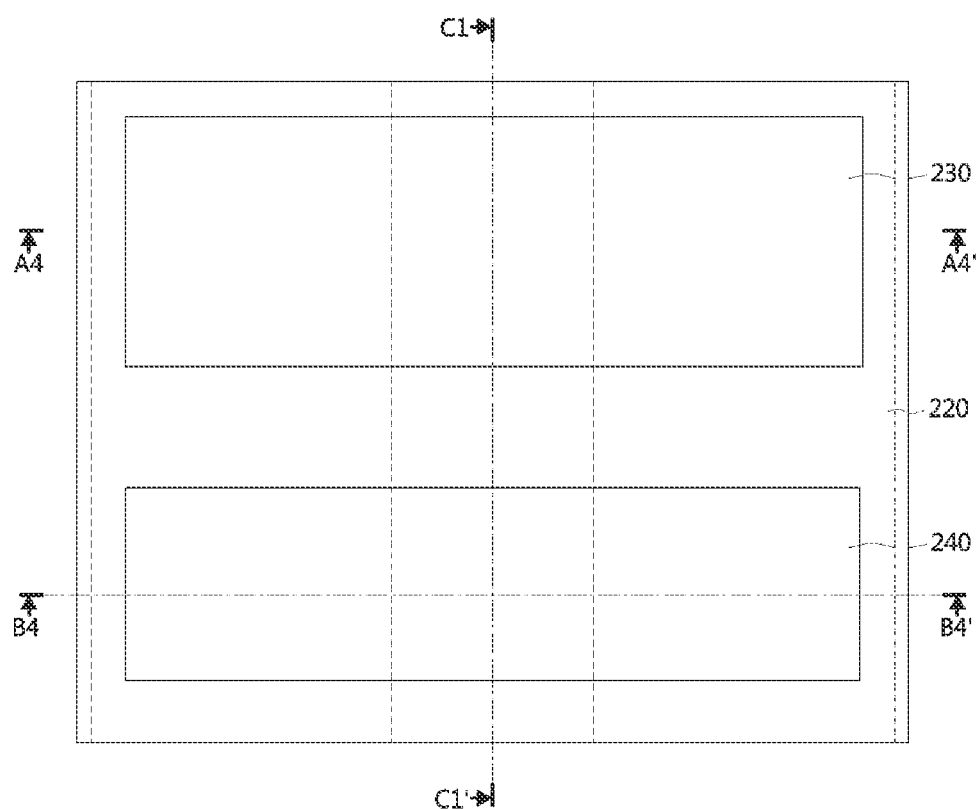
Figure 18:
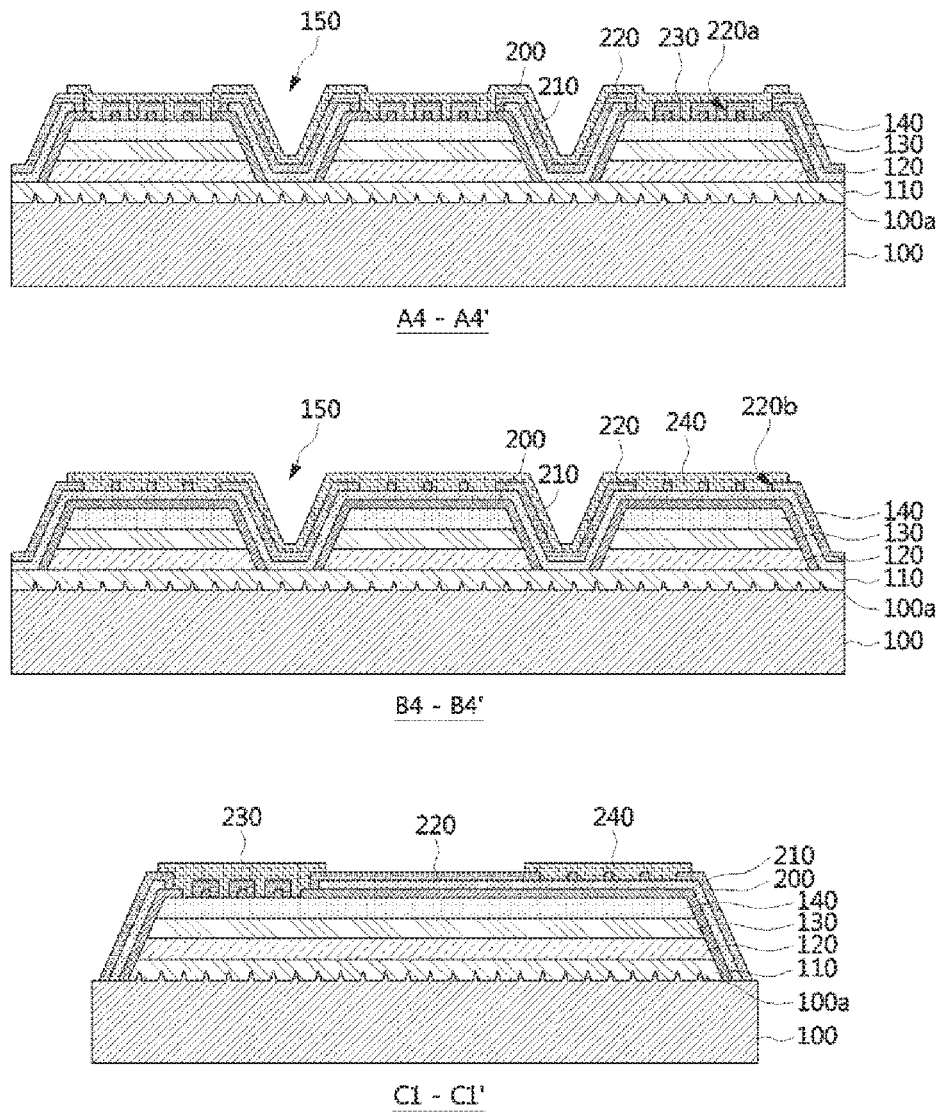

Referring to FIGS. 17 and 18, a first pad 230 and a second pad 240 are formed on the resultant structure of FIG. 15. The first pad 230 is electrically connected to the exposed reflection pattern 140 of the first pad region 205 in FIGS. 15 and 16. Accordingly, the first pad 230 and the second semiconductor layer 130 are electrically connected. The second semiconductor layer 130 is electrically connected to an external power source or power supply line through the first pad 230.

The second pad 240 is electrically connected to the exposed conductive reflection layer 140 of the second pad region 225 in FIGS. 15 and 16. Accordingly, the second pad 240 and the first semiconductor layer 110 are electrically connected. The first semiconductor layer 110 is electrically connected to an external power source or power supply line through the second pad 240.

In some implementations, an area of the first pad 230 electrically connected to the second semiconductor layer 130 is controlled to be greater than an area of the second pad 240 electrically connected to the first semiconductor layer 110. If the second semiconductor layer 130 is a p-type semiconductor layer, heat emission through the p-type semiconductor layer may be a problem. By increasing a contact area between the second pad 240 and a printed circuit board (PCB) to be greater than the area of the first pad 230, the problem regarding heat emission can be solved.

The first pad 230 and the second pad 240 may have a double layered structure including a layer including Ti, Cr, or Ni and a layer including Al, Cu, Ag, or Au. Also, the first pad 230 and the second pad 240 may be formed by patterning photoresist, depositing a metal material between patterned spaces, and removing the deposited metal material using a lift-off process. Also, a double or single metal layer is formed, and then a pattern is formed using a photolithography process, and the first and second pads 230 and 240 may be formed by a dry etching process or wet etching process using the pattern. Here, an etchant used during the dry or wet etching process may be determined depending on characteristics of an etched metal material.

In addition, a pad barrier layer (not shown) formed of or including a conductive material may be formed on the first pad 230 or the second pad 240. The pad barrier layer is provided to prevent diffusion of a metal during a subsequent process including bonding or soldering the pads 230 and 240. For example, during the bonding or soldering process, tin (Sn) atoms contained in a bonding metal or soldering material are prevented from diffusing into the pads 230 and 240, thereby increasing the resistivity of the pads 230 and 240. In some implementations, the pad barrier layer may include Cr, Ni, Ti W, TiW, Mo, Pt, or a combination thereof.

FIG. 17 shows a plan view illustrating an exemplary method of manufacturing an LED module and FIG. 18 shows cross-sectional views taken along a line A4-A4', a line B4-B4', and a line C1-C1' of the plan view of FIG. 17.

The line A4-A4' crosses the first pad 230. As shown in the cross-sectional view taken along the line A4-A4', the first pad 230 shields or covers a first pad region and is electrically connected to the reflection pattern 140. Accordingly, the second semiconductor layer 130 and the first pad 230 are electrically connected. Also, the first pad 230 may be formed in a mesa region 150.

The line B4-B4' crosses the second pad 240. As shown in the cross-sectional view taken along the line B4-B4', the second pad 240 is formed on a second pad region. Since selective portions of a conductive reflection layer 210 is exposed through a patterned second insulating layer 220 in the second pad region, the second pad 240 filling or covering the second pad region is electrically connected to the conductive reflection layer 210. Since the conductive reflection layer 210 is electrically connected to the first semiconductor layer 110 in the mesa region 150, the first semiconductor layer 110 is electrically connected to the second pad 240.

The line C1-C1' crosses the first pad 230 and the second pad 240, and the first semiconductor layer 110, an active layer 120, and the second semiconductor layer 130 formed on a substrate 100 using a mesa etching process have a predetermined inclination angle with respect to the surface of the substrate 100. Also, a first insulating layer 200, the conductive reflection layer 210, and the second insulating layer 220 are sequentially stacked on sidewalls of the first semiconductor layer 110, the active layer 120, and the second semiconductor layer 130.

In the first pad region, the first insulating layer 200 or the second insulating layer 220 is formed in a patterned shape, and selective portions of the reflection pattern 140 are opened or exposed. Also, the first pad 230 is formed on the first pad region. The first pad 230 is isolated from the second pad 240, which is another pad, by the second insulating layer 220.

Accordingly, the first pad 230 is electrically connected to the second semiconductor layer 130 through the reflection pattern 140.

Also, the second insulating layer 220 is formed in a patterned shape in the second pad region, and the conductive reflection layer 210 is opened or exposed in a region opened or exposed by the second pad 240. Accordingly, the second pad 240 is connected to the conductive reflection layer 210. The conductive reflection layer 210 is connected to the first semiconductor layer 110 in the mesa region 150. Accordingly, the second pad 240 is electrically connected to the first semiconductor layer 110.

In addition, an area of the reflection pattern 140 opened by the first insulating layer 200 or the second insulating layer 220 that are patterned in the first pad region exceeds an area of the conductive reflection layer 210 opened or exposed by the second insulating layer 220 patterned in the second pad region. This is because the reflection pattern 140 electrically connected to the first pad 230 is connected to the second semiconductor layer 130, and the conductive reflection layer 210 electrically connected to the second pad 240 is connected to the first semiconductor layer 110. In some implementations, the second semiconductor layer 130 has a p conductivity type and the first semiconductor layer 110 has an n conductivity type. The mobility of holes in a p-type semiconductor layer is lower than the mobility of electrons in an n-type semiconductor layer. Accordingly, a channel in which current is supplied through an electrode may be wider in a p type than in an n type.

In addition, the first insulating layer 200 or the second insulating layer 220 that is patterned on the reflection pattern 140 connected to the second semiconductor layer 130 prevents local current crowding. This prevents direct supply of current through a pad in high voltage or high-power conditions. With the patterned structures of the first insulating layer 200 or the second insulating layer 220, the first insulating layer 200 or the second insulating layer 220 screens some of current supplied from the first pad 230 disposed on the first or second insulating layer 200 or 220, and divides the screened current into a space between the first and second insulating layers. Thus, uniform current is supplied to the second semiconductor layer 130.

Furthermore, the first insulating layer 200 formed on side surfaces of the active layer 120, the second semiconductor layer 130, and the reflection pattern 140 functions as a reflection plate of light generated in the active layer 120. For instance, when a wavelength of light generated in the active layer is λ, a thickness of the first insulating layer 200 may be an integer multiple of λ/4. In this case, reflection of light may be performed on the surface of the first insulating layer 200, and constructive interference may occur.

For example, when the wavelength of light generated in the active layer 120 has a center wavelength of about 450 nm, the first insulating layer 200 may be formed to a thickness of about 8000 Å to about 9000 Å. Also, the thickness of the second insulating layer 220 may be smaller than the thickness of the first insulating layer 200.

In addition, when a flip-chip-type LED module is applied to a PCB, a side surface of the substrate 100 may have an uneven structure using a sawing or laser cutting process. Light generated in the active layer 120 is easily emitted to the outside through the substrate 100 having the side surface with the uneven structure.

In an LED module formed through the above-described processes, pads are formed on the patterned pad regions. Thus, local current crowding may be prevented. Also, diffusion of a metal is prevented by the reflection barrier layer provided between the conductive reflection layer 210 and the pads. For instance, a metal of the conductive reflection layer 210 is prevented from moving to the second pad 240 and increasing the resistivity of the second pad 240. Also, the second semiconductor layer 130 is electrically connected to the first pad 230. A pad barrier layer is formed on each of the pads. The pad barrier layer prevents diffusion of the metal generated during a bonding or soldering process so that the first pad 230 or the second pad 240 can have a high conductivity and be in electrical contact with the outside.

Figure 19:
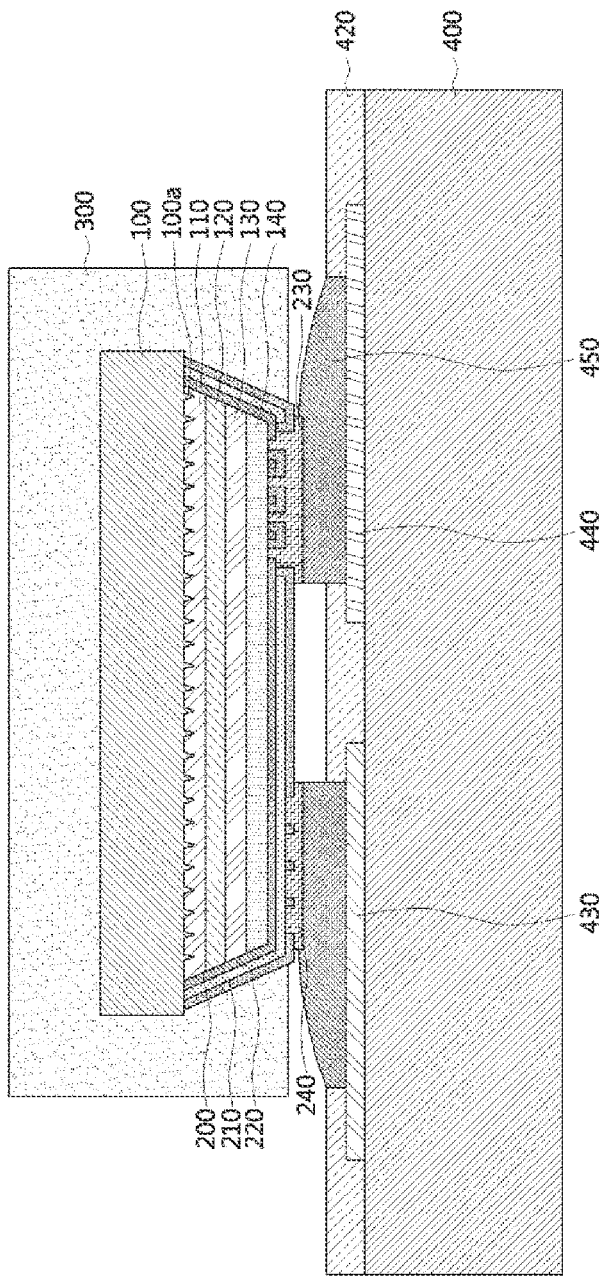
FIG. 19 is a cross-sectional view of an LED package according to another implementation of the disclosed technology.

FIG. 19 is a cross-sectional view of an exemplary LED package according to another implementation of the disclosed technology.

Referring to FIG. 19, after a final resultant structure described with reference to FIGS. 17 and 18 is separated into respective unit modules, a phosphor layer 300 is formed on side and rear surfaces of each of the unit modules. The phosphor layer 300 may be formed by processes including re-arranging a plurality of separated unit modules such that the substrate 100 faces upward, and coating a phosphor slurry on the substrate 100. In this case, the phosphor slurry may also be coated on side surfaces of the modules. Subsequently, the phosphor slurry is cured and separated into respective modules again.

Meanwhile, a package substrate 400 is provided. A first bonding pad 430 and a second bonding pad 440 may be disposed on the package substrate 400 and spaced apart from one another. A solder resist layer 420 having an opening exposing partial upper regions of the bonding pads 430 and 440 may be disposed on the bonding pads 430 and 440.

The module having the phosphor layer 300 is disposed on the package substrate 400. Thereafter, a first pad 230 and a second pad 240 of the module are electrically connected to the first bonding pad 430 and the second bonding pad 440 using conductive adhesives 430 and 450.

Furthermore, in the present implementation, the phosphor layer 300 absorbs light generated in the active layer 120 and generates light having a different wavelength. The phosphor layer 300 may be a single layer or have a multi-layered structure. For example, the phosphor layer 300 which has characteristics for wavelength conversion may have a stacked structure of a first phosphor layer (not shown) and a second phosphor layer (not shown). For instance, the first phosphor layer may have an regular uneven configurations defining grooves, and the second phosphor layer may be formed to fill grooves of the first phosphor layer.

In addition, when the phosphor layer 300 has characteristics for wavelength conversion into a plurality of wavelengths, the first phosphor layer may be formed of or include a different material from the second phosphor layer. Alternatively, the first and second phosphor layers may be formed of or include the same kind of phosphor with different concentrations.

The phosphor layer 300 may be coated or formed of a molding resin using a dispenser. Alternatively, the phosphor layer 300 may be formed using a spraying process, a molding process, a printing process, or a filling process in vacuum.

FIGS. 20 through 29 are plan views and cross-sectional views illustrating a method of manufacturing an LED module according to another implementations of the disclosed technology.

Figure 20:
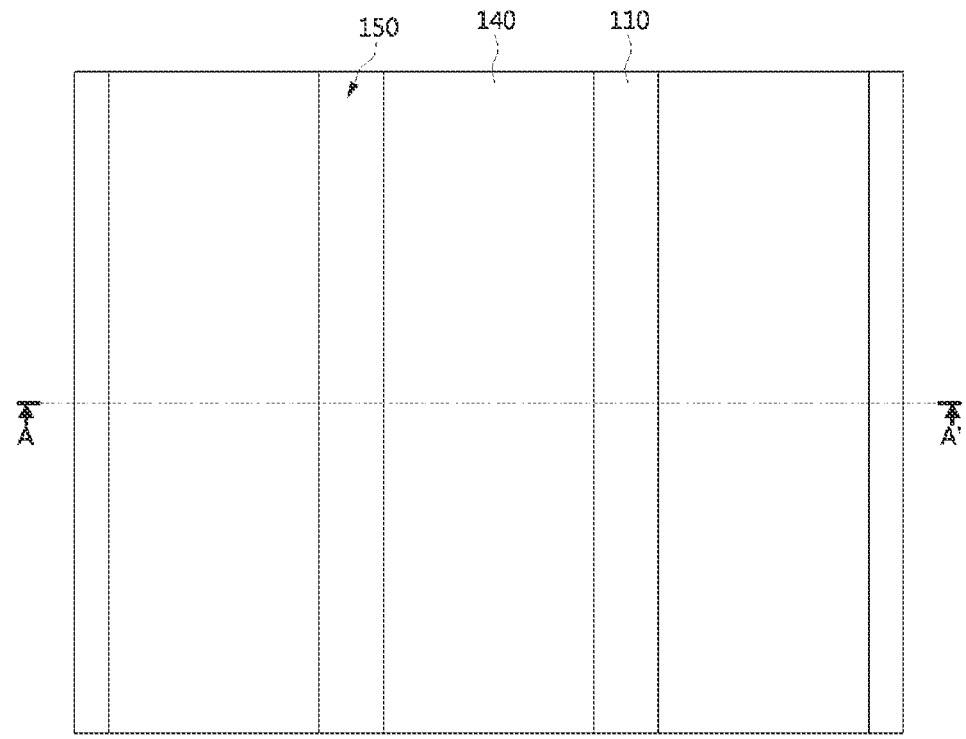
Figure 21:
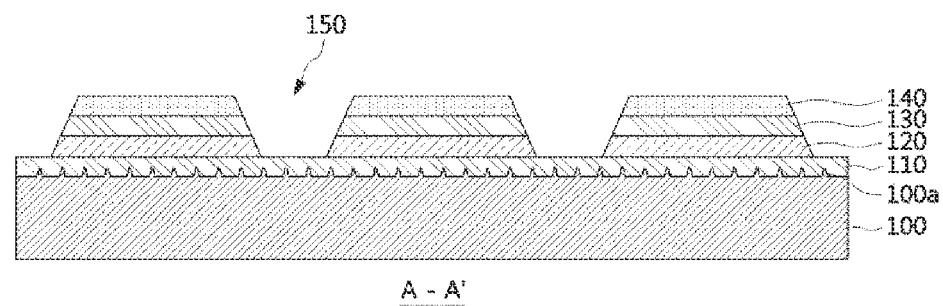

Referring to FIGS. 20 and 21, FIG. 20 shows a plan view illustrating an exemplary method of manufacturing an LED module and FIG. 21 shows a cross-sectional view taken along a direction A-A' of FIG. 20.

A first semiconductor layer 110, an active layer 120, and a second semiconductor layer 130 are sequentially stacked on a substrate 100, and a mesa region 150 is formed using an etching process. A portion of a surface of the first semiconductor layer 110 is exposed through the mesa region 150. Also, a reflection pattern 140 is formed on the second semiconductor layer 130.

In the drawings of the present implementation, the reflection pattern 140 is exaggerated for brevity. In one implementation, the reflection pattern 140 may be formed in the same manner as described with regard to FIGS. 4 through 8. In another implementation, the reflection pattern 140 may be formed using other different techniques.

In some implementations, the substrate 100 may be a substrate on which surface treatment is not performed, or a patterned substrate. Also, a surface of the substrate 100 may have a moth-eye structure. For example, pointed structures 100a may be densely disposed on the surface of the substrate 100. Alternatively, the substrate 100 may have a protrusion protruding in a roughly hemispherical shape, and pointed structures may be densely disposed on the protrusion.

Figure 22:
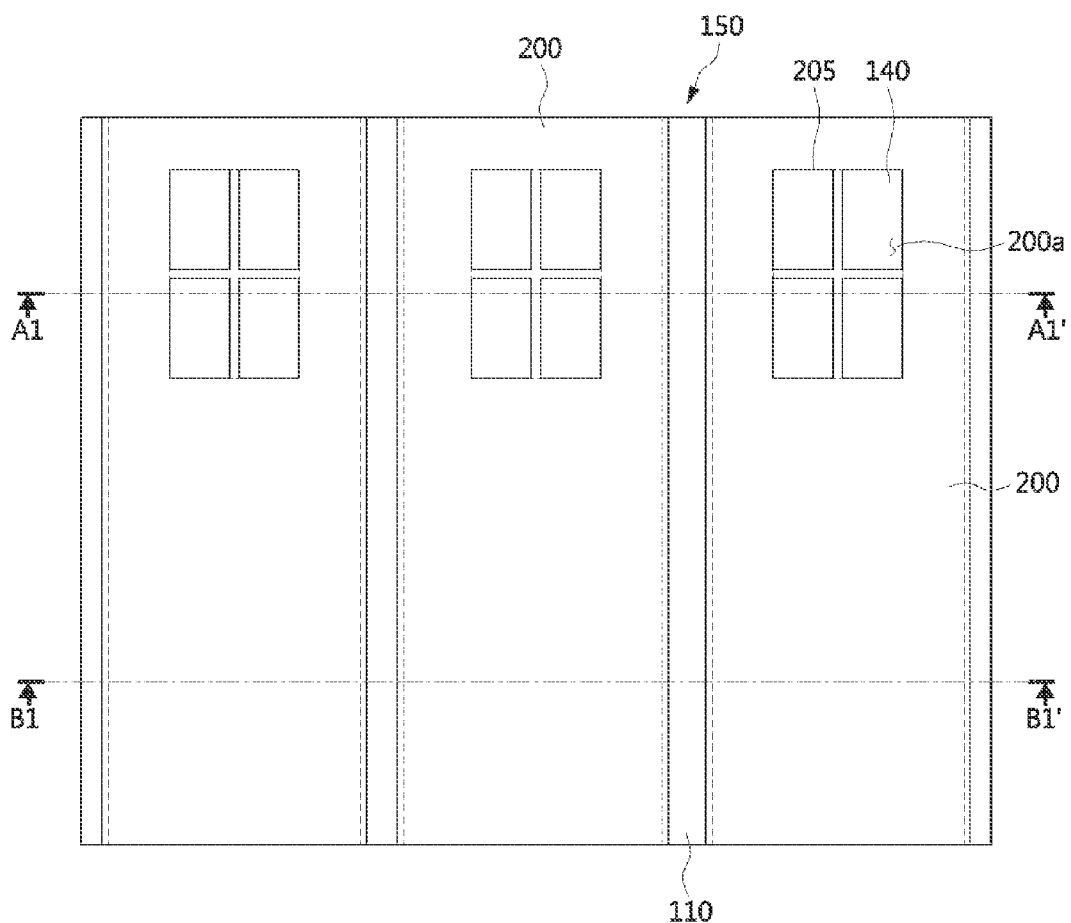
Figure 23:
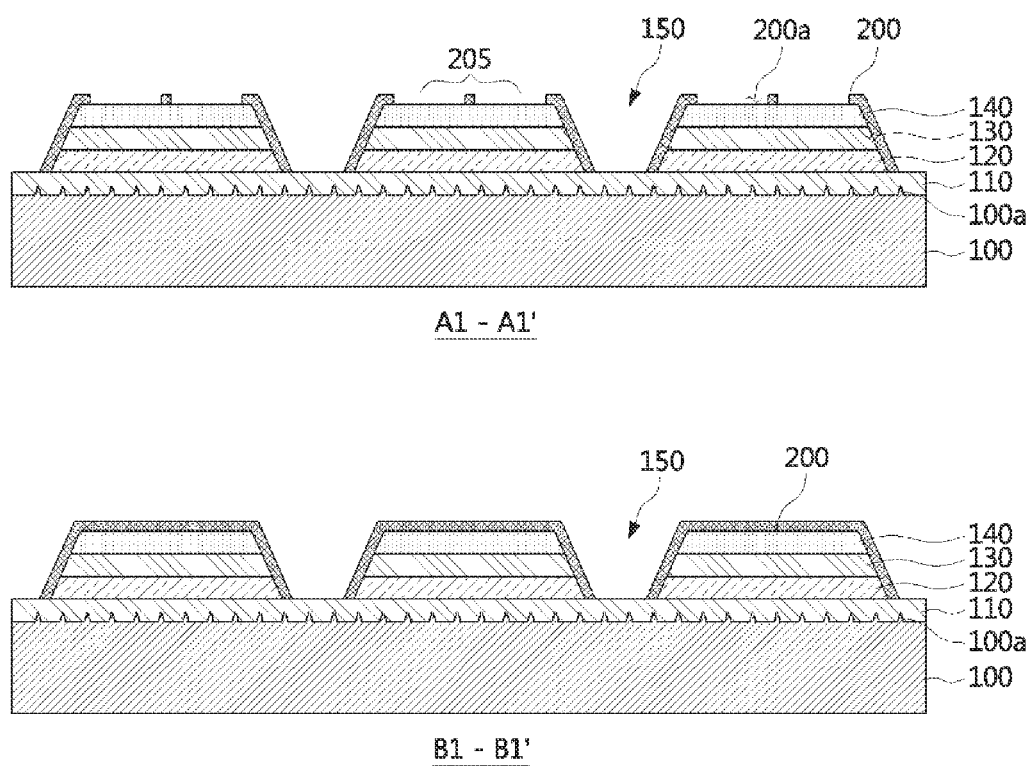

Referring to FIGS. 22 and 23, a first insulating layer 200 is formed on the resultant structure of FIG. 20. The first insulating layer 200 may be formed of or include a transparent nonconductor. In one implementation, silicon oxide may be used as the first insulating layer 200. The first insulating layer 200 is patterned using a photoresist process. By patterning the first insulating layer 200, the first semiconductor layer 110 formed in the mesa region 150 is exposed, and selective portions of the reflection pattern 140 are exposed. A first pad region 205 is defined to include the exposed selective portions of the reflection pattern 140 and the patterned first insulating layer 200 formed on the reflection pattern 140.

FIG. 22 shows a plan view illustrating an exemplary method of manufacturing an LED module and FIG. 23 shows cross-sectional views taken along the direction A1-A1' and the direction B1-B1' of FIG. 22.

Referring to the cross-sectional view taken along the direction A1-A1', the first insulating layer 200 is provided in a patterned shape on the reflection pattern 140 to expose selective portions of the reflection pattern 140. Also, the first insulating layer 200 is not formed in the mesa region 150 to expose the first semiconductor layer 110. In one implementation, the reflection pattern 140 exposed by the first insulating layer 200 in the first pad region 205 may be provided in the form of a hole 200a as shown in FIG. 23. However, other implementations are also possible such that the reflection pattern 140 exposed by the first insulating layer 200 in the first pad region 205 may be or include a stripe form.

Referring to the cross-sectional view taken along the direction B1-B1', the first insulating layer 200 completely shields or covers the reflection pattern 140. The first semiconductor layer 110 is exposed in the mesa region 150.

Figure 24:
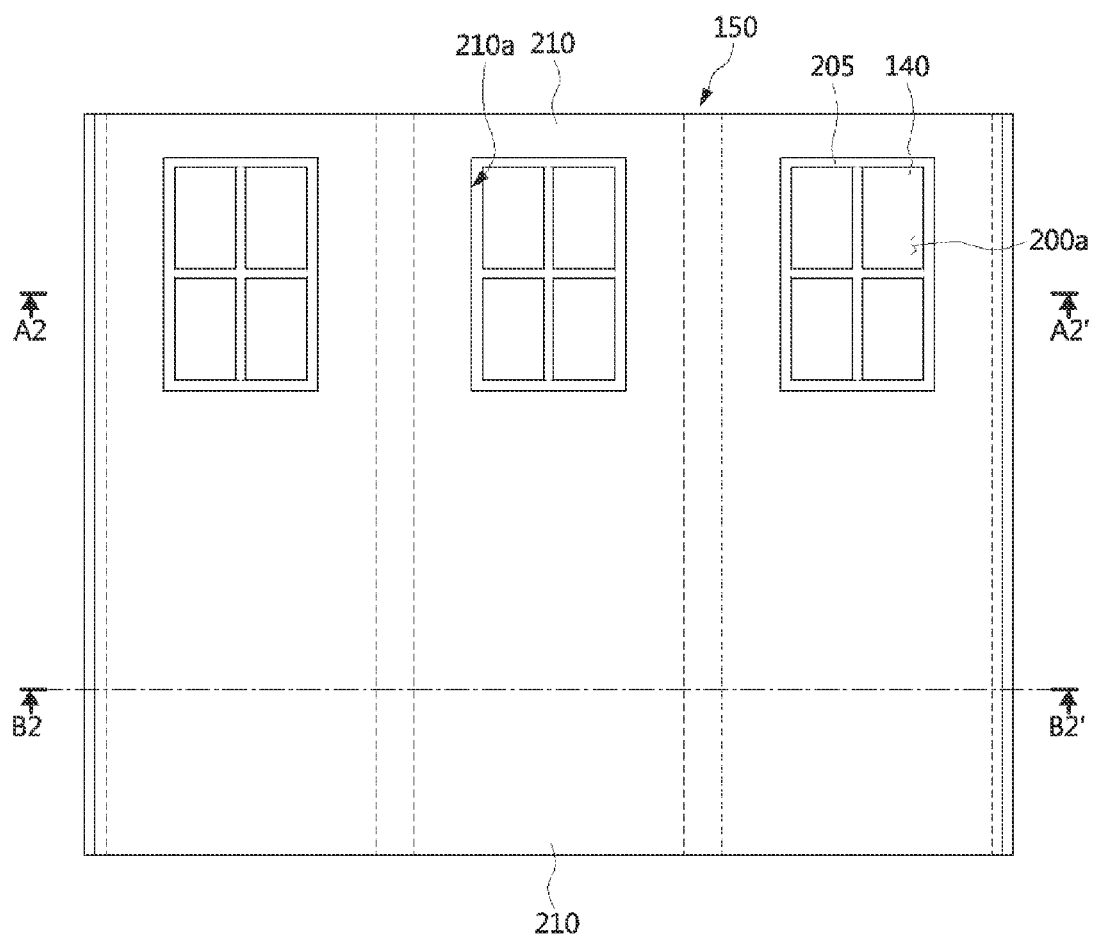

Referring to FIGS. 24 and 25, a conductive reflection layer 210 is formed.

Referring to FIG. 24, the conductive reflection layer 210 is coated on the entire surface of the resultant structure of FIG. 22 except an opening 210a. The first pad region 205 is exposed within the opening 210a. Also, the conductive reflection layer 210 is formed in the mesa region 150 and electrically connected to the first semiconductor layer 110.

FIG. 24 shows a plan view illustrating an exemplary method of manufacturing an LED module and FIG. 25 shows cross-sectional views taken along a line A2-A2' and a line B2-B2' of FIG. 24.

Referring to the cross-sectional view taken along the line A2-A2', the conductive reflection layer 210 is formed on the first insulating layer 200 and the exposed first semiconductor layer 110.

Accordingly, the conductive reflection layer 210 is coated on the entire surface except the first pad region 205, and formed on the first semiconductor layer 110 exposed in the mesa region 150 and electrically connected to the first semiconductor layer 110.

The conductive reflection layer 210 is formed of or includes a conductive material. The conductive reflection layer 210 may include Al. Accordingly, the first semiconductor layer 110 and the conductive reflection layer 210 are electrically connected, and the reflection pattern 140 is electrically insulated from the conductive reflection layer 210 by the first insulating layer 200.

In addition, a reflection barrier layer (not shown) may be formed on the conductive reflection layer 210. The reflection barrier layer prevents diffusion of a metal of the conductive reflection layer 210. In one implementation, the reflection barrier layer may be a single layer formed of or including Ni, Cr, or Au, or a combination thereof. In another implementation, the reflection barrier layer is a combined layer formed of or including Ti/Al/Ti/Ni/Au. Also, an adhesive layer (not shown) may be further provided under the conductive reflection layer 210. The adhesive layer may include Ti, Cr, or Ni.

The conductive reflection layer 210 may be performed by stacking the conductive reflection layer 210 and patterning the conductive reflection layer 210 using an etching process. Alternatively, the conductive reflection layer 210 may be formed using a lift-off process. That is, photoresist is coated on the first pad region 205 in which selective portions of the reflection pattern 140 are exposed, and the conductive reflection layer 210 is formed using a deposition process. Then, by removing the photoresist from the first pad region 205, the conductive reflection layer 210 is formed to expose the first pad region 205.

Figure 26:
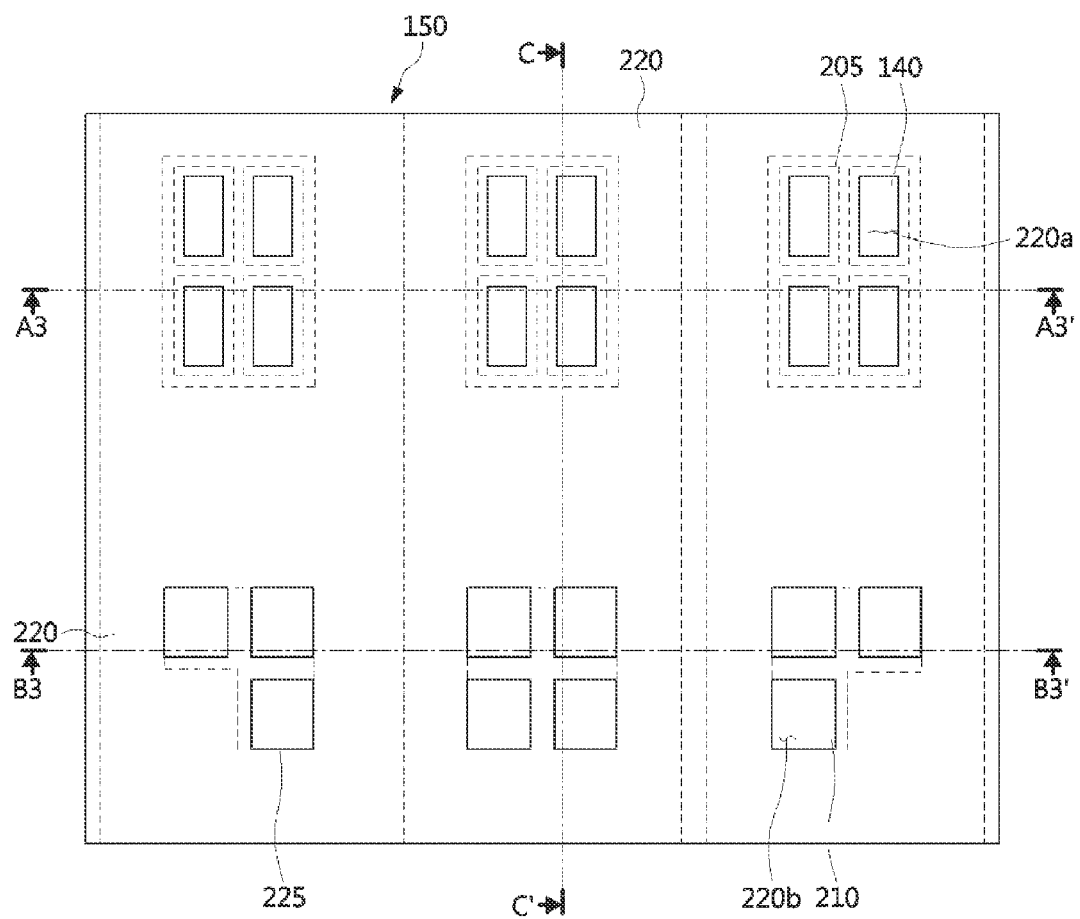

Referring to FIGS. 26 and 27, a second insulating layer 220 is formed on the resultant structure of FIG. 24.

Referring to a plan view of FIG. 26, the second insulating layer 220 includes first holes 220a and second holes 220b. The first holes 220a are formed in the first pad region 205, and an underlying second pad region 225 is defined by the second holes 220b. Selective portions of the conductive reflection layer 210 are exposed by the second holes 220b formed in the second pad region 225. When a reflection barrier layer is formed on the conductive reflection layer 210, selective portions of the reflection barrier layer may be exposed by the second holes 220b formed in the second pad region 225.

In FIG. 26, the number of first holes 220a may be equal to or greater than the number of second holes 220b. This facilitates diffusion of current through the reflection pattern 140 exposed by the first holes 220a. When the second semiconductor layer 130 is or includes a p-type semiconductor layer, current division into the p-type semiconductor layer becomes a problem in applying current. Accordingly, by controlling the number of first holes 220a to be equal to or greater than the number of second holes 220b, current may be smoothly divided into the second semiconductor layer 130.

This will be clearly described with reference to a cross-sectional view of FIG. 27.

FIG. 26 shows a plan view illustrating an exemplary method of manufacturing an LED module and FIG. 27 illustrates cross-sectional views taken along lines A3-A3', B3-B3', and C-C' of FIG. 26.

The line A3-A3' crosses the first pad region 205, and the second insulating layer 220 is formed on the conductive reflection layer 210 in the cross-sectional view taken along the line A3-A3'. When a reflection barrier layer is formed on the conductive reflection layer 210, the second insulating layer 220 is formed on the reflection barrier layer. The second insulating layer 220 has the first holes 220a in the first pad region 205, and is also formed on the mesa region 150. In some implementations, the second insulating layer 220 may be formed on the first insulating layer 200 formed on the first pad region 205. In other implementations, the second insulating layer 220 may be not formed on the first insulating layer 200 disposed on the first pad region 205.

Also, the line B3-B3' crosses the second pad region 225, and the second insulating layer 220 is formed on the conductive reflection layer 210 disposed on the mesa region 150 in the cross-sectional view taken along the line B3-B3'. In addition, the second insulating layer 220 is formed to expose selective portions of the conductive reflection layer 210 formed on the reflection pattern 140 except the mesa region 150. That is, the second insulating layer 220 is provided in a patterned shape on the conductive reflection layer 210 disposed on the reflection pattern 140. Accordingly, the selective portions of the conductive reflection layer 210 are exposed to define the second pad region 225. The second pad region 225 includes the exposed selected portion of the conductive reflection layer 210 and the patterned second insulating layer 220 formed on the conductive reflection layer 210. In some implementations, the portion of the conductive reflection layer 210 may be also exposed on the mesa region 150. Furthermore, the second insulating layer 220 in the second pad region 225 may expose the conductive reflection layer 210 such that the exposed conductive reflection layer 210 forms in the shape of the second holes 220b or in a stripe form.

The line C-C' crosses the first pad region 205 and the second pad region 225, and the second insulating layer 220 is formed on the conductive reflection layer 210 in the cross-sectional view taken along the line C-C'. The second insulating layer 220 exposes selective portions of the underlying reflection pattern 140 in the first pad region 205, and shields or covers the conductive reflection layer 210 between the first and second pad regions 205 and 225. Also, the second insulating layer 220 is provided in a patterned shape in the second pad region 225 to expose the underlying conductive reflection layer 210.

The second insulating layer 220 may be formed of or include any insulating material. In some implementations, an oxide-based insulating material, a nitride-based insulating material, a polymer (e.g., polyimide, Teflon, or parylene) may be used to form the second insulating layer 220.

Figure 28:
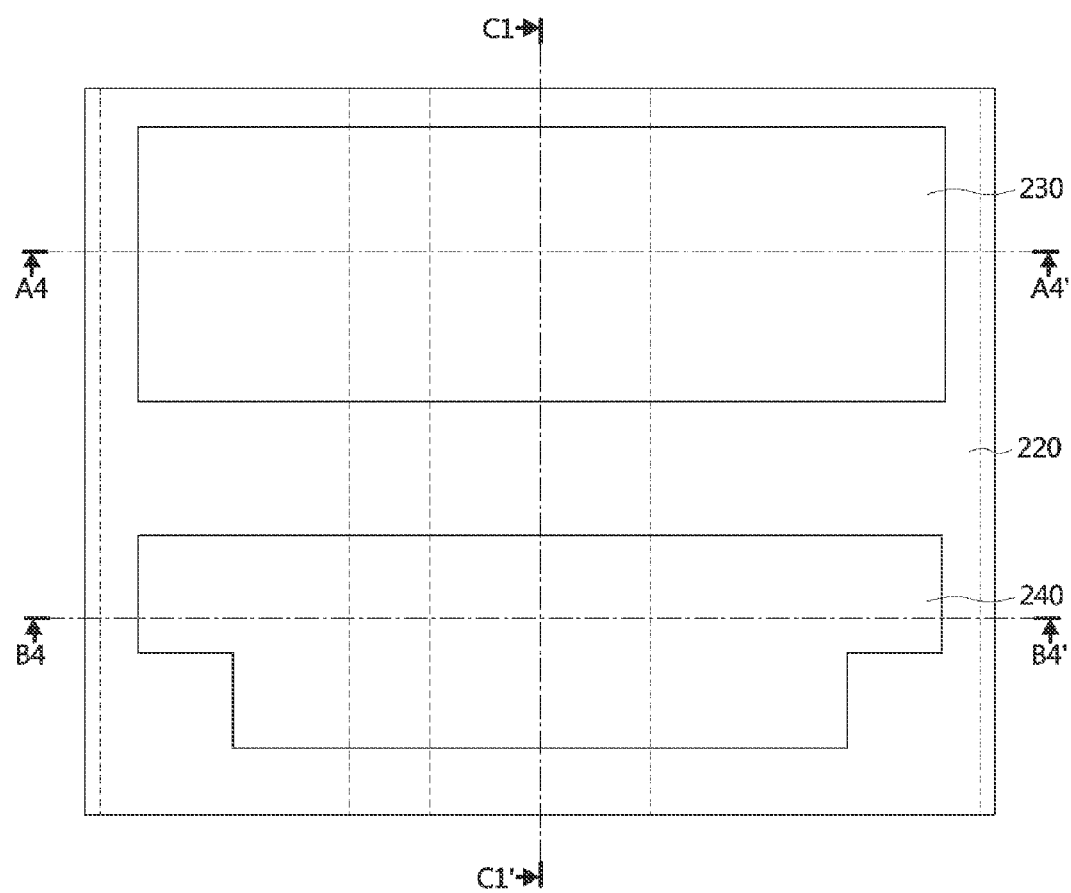
Figure 29:
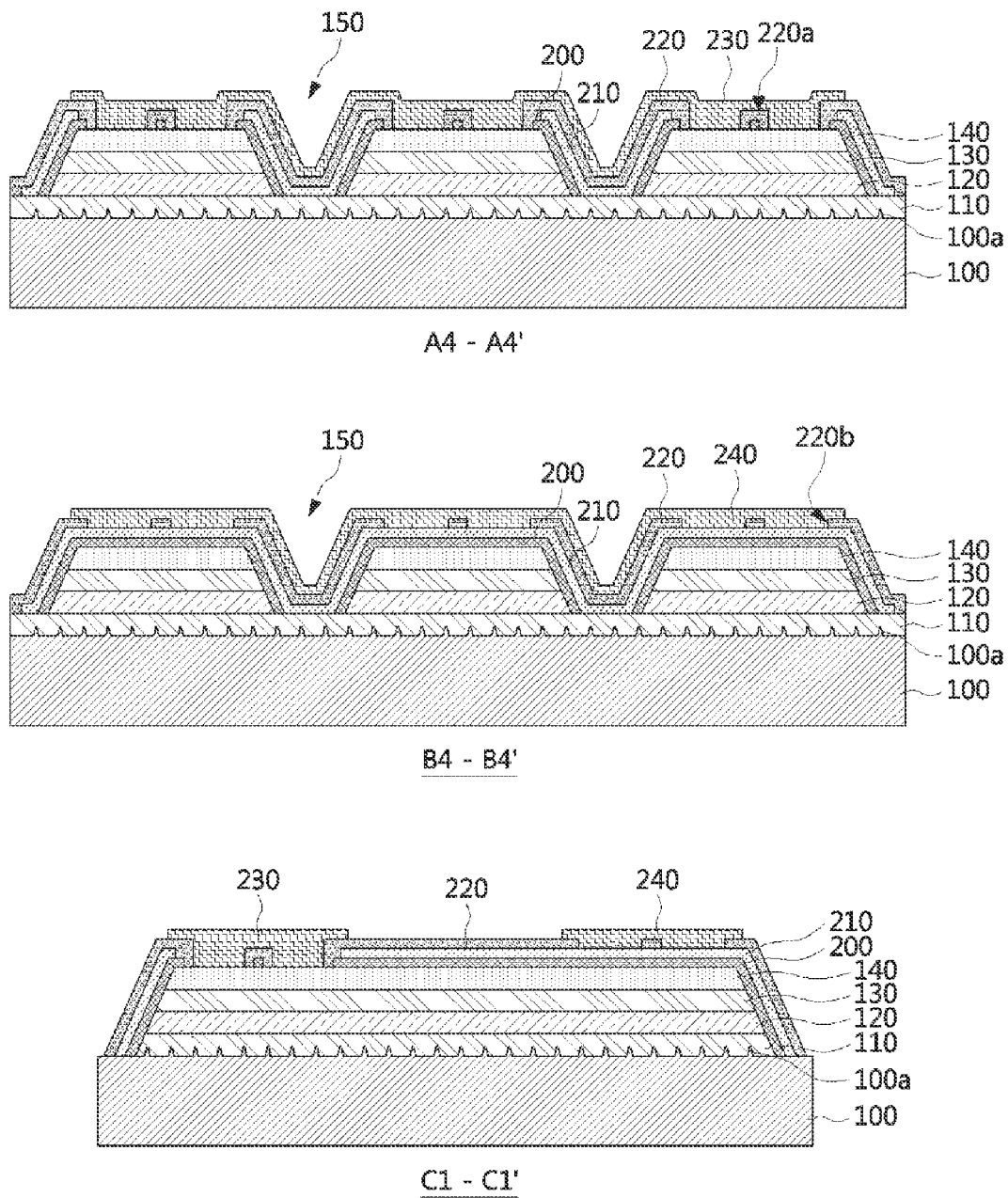

Referring to FIGS. 28 and 29, a first pad 230 and a second pad 240 are formed on the resultant structure of FIG. 26. The first pad 230 is electrically connected to the exposed reflection pattern 140 of the first pad region 205 in FIGS. 26 and 27. Accordingly, the first pad 230 and the second semiconductor layer 130 are electrically connected. This indicates that the second semiconductor layer 130 is electrically connected to an external power source or power supply line through the first pad 230.

Also, the second pad 240 is electrically connected to the exposed conductive reflection layer 140 of the second pad region 225 in FIGS. 26 and 27. Accordingly, the second pad 240 and the first semiconductor layer 110 are electrically connected. This indicates that the first semiconductor layer 110 is electrically connected to an external power source or power supply line through the second pad 240.

In some implementations, an area of the first pad 230 electrically connected to the second semiconductor layer 130 is controlled to be greater than an area of the second pad 240 electrically connected to the first semiconductor layer 110. If the second semiconductor layer 130 is a p-type semiconductor layer, heat emission through the p-type semiconductor layer may be a problem. By increasing a contact area between the second pad 240 and a printed circuit board (PCB) to become greater than the area of the first pad 230, the problem regarding heat emission may be solved.

The first pad 230 and the second pad 240 may have a double layered structure including a layer including Ti, Cr, or Ni and a layer including Al, Cu, Ag, or Au. Also, the first pad 230 and the second pad 240 may be formed by patterning photoresist, depositing a metal material between patterned spaces, and removing the deposited metal material using a lift-off process. Also, a double or single metal layer is formed, and then a pattern is formed using a photolithography process, and the first and second pads 230 and 240 may be formed by a dry etching process or wet etching process using the pattern. Here, an etchant used during the dry or wet etching process may be determined depending on characteristics of an etched metal material.

In addition, a pad barrier layer (not shown) formed of or including a conductive material may be formed on the first pad 230 or the second pad 240. The pad barrier layer is provided to prevent diffusion of a metal during a subsequent process including bonding or soldering the pads 230 and 240. For example, during the bonding or soldering process, tin (Sn) atoms contained in a bonding metal or soldering material are prevented from diffusing into the pads 230 and 240, thereby increasing the resistivity of the pads 230 and 240. In some implementations, the pad barrier layer may include Cr, Ni, Ti W, TiW, Mo, Pt, or a combination thereof.

FIG. 28 shows a plan view illustrating an exemplary method of manufacturing an LED module and FIG. 29 illustrates cross-sectional views taken along a line A4-A4', a line B4-B4', and a line C1-C1' of FIG. 28.

The line A4-A4' crosses the first pad 230, and as shown in the cross-sectional view taken along the line A4-A4' the first pad 230 shields or covers a first pad region and is electrically connected to the reflection pattern 140. Accordingly, the second semiconductor layer 130 and the first pad 230 are electrically connected. Also, the first pad 230 may be formed in a mesa region 150.

The line B4-B4' crosses the second pad 240, and as shown in the cross-sectional view taken along the line B4-B4', the second pad 240 is formed on a second pad region. Since selective portions of a conductive reflection layer 210 is exposed through a patterned second insulating layer 220 in the second pad region, the second pad 240 filling or covering the second pad region is electrically connected to the conductive reflection layer 210. Since the conductive reflection layer 210 is electrically connected to the first semiconductor layer 110 in the mesa region 150, the first semiconductor layer 110 is electrically connected to the second pad 240.

The line C1-C1' crosses the first pad 230 and the second pad 240, and the first semiconductor layer 110, an active layer 120, and the second semiconductor layer 130 formed on a substrate 100 using a mesa etching process have a predetermined inclination angle with respect to the surface of the substrate 100. Also, a first insulating layer 200, the conductive reflection layer 210, and the second insulating layer 220 are sequentially stacked on sidewalls of the first semiconductor layer 110, the active layer 120, and the second semiconductor layer 130.

In the first pad region, the first insulating layer 200 or the second insulating layer 220 is formed in a patterned shape, and selective portions of the reflection pattern 140 are opened or exposed. Also, the first pad 230 is formed on the first pad region. The first pad 230 is isolated from the second pad 240, which is another pad, by the second insulating layer 220.

Accordingly, the first pad 230 is electrically connected to the second semiconductor layer 130 through the reflection pattern 140.

Also, the second insulating layer 220 is formed in a patterned shape in the second pad region, and the conductive reflection layer 210 is opened or exposed in a region opened or exposed by the second pad 240. Accordingly, the second pad 240 is connected to the conductive reflection layer 210. The conductive reflection layer 210 is connected to the first semiconductor layer 110 in the mesa region 150. Accordingly, the second pad 240 is electrically connected to the first semiconductor layer 110.

In addition, an area of the reflection pattern 140 opened by the first insulating layer 200 or the second insulating layer 220 that are patterned in the first pad region exceeds an area of the conductive reflection layer 210 opened or exposed by the second insulating layer 220 patterned in the second pad region. This is because the reflection pattern 140 electrically connected to the first pad 230 is connected to the second semiconductor layer 130, and the conductive reflection layer 210 electrically connected to the second pad 240 is connected to the first semiconductor layer 110. In some implementations, the second semiconductor layer 130 has a p conductivity type and the first semiconductor layer 110 has an n conductivity type. The mobility of holes in a p-type semiconductor layer is lower than the mobility of electrons in an n-type semiconductor layer. Accordingly, a channel in which current is supplied through an electrode may be wider in a p type than in an n type.

In addition, the first insulating layer 200 or the second insulating layer 220 that is patterned on the reflection pattern 140 connected to the second semiconductor layer 130 prevents local current crowding. This prevents direct supply of current through a pad in high-voltage or high-power conditions. With the patterned structures of the first insulating layer 200 or the second insulating layer 220 patterned, the first insulating layer 200 or the second insulating layer 220 screens some of current supplied from the first pad 230 disposed on the first or second insulating layer 200 or 220, and divides the screened current into a space between the first and second insulating layers. Thus, uniform current is supplied to the second semiconductor layer 130.

Furthermore, the first insulating layer 200 formed on side surfaces of the active layer 120, the second semiconductor layer 130, and the reflection pattern 140 functions as a reflection plate of light generated in the active layer 120. For instance, when a wavelength of light generated in the active layer is $\lambda$, a thickness of the first insulating layer 200 may be an integer multiple of $\lambda/4$. In this case, reflection of light may be performed on the surface of the first insulating layer 200, and constructive interference may occur.

For example, when the wavelength of light generated in the active layer 120 has a center wavelength of about 450 nm, the first insulating layer 200 may be formed to a thickness of about 8000 Å to about 9000 Å. Also, the thickness of the second insulating layer 220 may be smaller than the thickness of the first insulating layer 200.

In addition, when a flip-chip-type LED module is applied to a PCB, a side surface of the substrate 100 may have an uneven structure using a sawing or laser cutting process. Light generated in the active layer 120 is easily emitted to the outside through the substrate 100 having the side surface with the uneven structure.

In an LED module formed using the above-described processes, pads are formed on the patterned pad regions. Thus, local current crowding may be prevented. Also, diffusion of a metal is prevented by the reflection barrier layer provided between the conductive reflection layer 210 and the pads. For instance, a metal of the conductive reflection layer 210 is prevented from moving to the second pad 240 and increasing the resistivity of the second pad 240. Also, the second semiconductor layer 130 is electrically connected to the first pad 230. A pad barrier layer is formed on each of the pads. The pad barrier layer prevents diffusion of the metal generated during a bonding or soldering process so that the first pad 230 or the second pad 240 can have a high conductivity and be in electrical contact with the outside.

Figure 30:
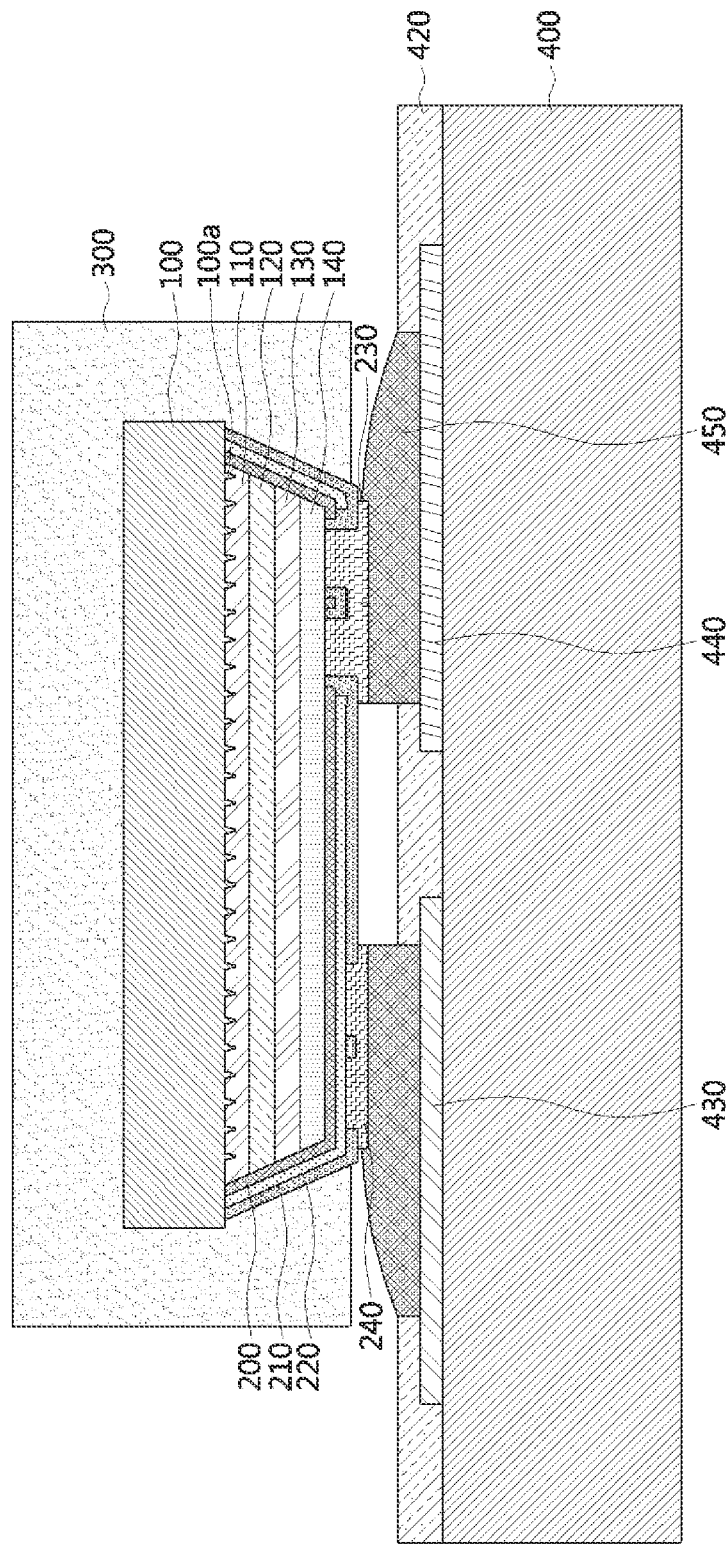
FIG. 30 is a cross-sectional view of an LED package according to another implementation of the disclosed technology.

FIG. 30 is a cross-sectional view of an exemplary LED package according to another implementation of the disclosed technology.

Referring to FIG. 30, after a final resultant structure described with reference to FIGS. 28 and 29 is separated into respective unit modules, a phosphor layer 300 is formed on side and rear surfaces of each of the unit modules. The phosphor layer 300 may be formed by processes including re-arranging a plurality of separated unit modules such that the substrate 100 faces upward, and coating a phosphor slurry on the substrate 100. In this case, the phosphor slurry may also be coated on side surfaces of the modules. Subsequently, the phosphor slurry is cured and separated into respective modules.

Meanwhile, a package substrate 400 is provided. A first bonding pad 430 and a second bonding pad 440 may be disposed on the package substrate 400 and spaced apart from one another. A solder resist layer 420 having an opening exposing partial upper regions of the bonding pads 430 and 440 may be disposed on the bonding pads 430 and 440.

The module having the phosphor layer 300 is disposed on the package substrate 400. Thereafter, a first pad 230 and a second pad 240 of the module are electrically connected to the first bonding pad 430 and the second bonding pad 440 using conductive adhesives 430 and 450.

Furthermore, in the present implementation, the phosphor layer 300 absorbs light generated in the active layer 120 and generates light having a different wavelength. The phosphor layer 300 may be a single layer or have a multi-layered structure. For example, the phosphor layer 300 which has characteristics for wavelength conversion may have a stacked structure of a first phosphor layer (not shown) and a second phosphor layer (not shown). For instance, the first phosphor layer may have an regular uneven configurations defining grooves, and the second phosphor layer may be formed to fill grooves of the first phosphor layer.

In addition, when the phosphor layer 300 has characteristics for wavelength conversion into a plurality of wavelengths, the first phosphor layer may be formed of or include a different material from the second phosphor layer. Alternatively, the first and second phosphor layers may be formed of or include the same kind of phosphor with different concentrations.

The phosphor layer 300 may be coated or formed of a molding resin using a dispenser. Alternatively, the phosphor layer 300 may be formed using a spraying process, a molding process, a printing process, or a filling process in vacuum.

Although some embodiments and examples of the disclosed technology have been described above, the disclosed technology is not limited by the disclosed embodiments and examples, and can be implemented in various ways.

What is claimed is:

1. A light emitting diode (LED) module comprising:
   an LED unit having a stacked structure including a first semiconductor layer, an active layer, a second semiconductor layer, and a reflection pattern that are formed over a substrate, and including a mesa region exposing at least a portion of a surface of the first semiconductor layer;
a first insulating layer formed over selected portions of the stacked structure to expose the mesa region, the first insulating layer patterned on the reflection pattern to form a first pad region;
a conductive reflection layer formed over the first insulating layer and the first semiconductor layer exposed in the mesa region;
a second insulating layer formed over the conductive reflection layer, the second insulating layer patterned on the conductive reflection layer to form a second pad region;
a first pad formed over the first pad region; and
a second pad formed over the second pad region.

2. The LED module of claim 1, wherein the patterned first insulating layer exposes selective portions of the reflection pattern.

3. The LED module of claim 1, wherein the patterned second insulating layer exposes selective portions of the conductive reflection layer.

4. The LED module of claim 1, wherein when a wavelength of light generated in the active layer is $\lambda$, a thickness of the first insulating layer is an integer multiple of $\lambda/4$.

5. The LED module of claim 1, wherein the reflection pattern comprises:
a reflective metal layer formed over the second semiconductor layer and configured to reflect light; and
a conductive barrier layer configured to cover the reflective metal layer and extend over the second semiconductor layer.

6. The LED module of claim 3, wherein an area of the exposed reflection pattern is greater than an area of the exposed conductive reflection layer.

7. The LED module of claim 3, wherein the first and second pad regions include holes and the number of holes in the first pad region is equal to or greater than the number of holes in the second pad region.

8. The LED module of claim 3, wherein an area of the first pad is greater than an area of the second pad.

9. The LED module of claim 5, wherein the conductive barrier layer has a thickness depending on an underlying layer.

10. The LED module of claim 5, wherein a side surface of the reflective metal layer forms an inclined angle of about 5° to about 45° with respect to a surface of the second semiconductor layer.

11. A method of manufacturing a light emitting diode (LED) module, comprising:
forming a stacked structure including a first semiconductor layer, an active layer, a second semiconductor layer, and a reflective pattern;
forming a first insulating layer over selected portions of the stacked structure to expose portions of the reflection pattern and portions of the first semiconductor layer, wherein the exposed portions of the reflection pattern and the first insulating layer over the reflection pattern define a first pad region;
forming a conductive reflection layer over the first insulating layer to electrically connect with the exposed portions of the first semiconductor layer, and expose the first pad region;
forming a second insulating layer over the conductive reflection layer to expose portions of the reflection pattern and portions of the conductive reflection layer, wherein the exposed portions of the conductive reflection layer and the second insulating layer over the conductive reflection layer define a second pad region; and
forming a first pad over the first pad region and forming a second pad over the second pad region.

12. The method of claim 11, wherein the forming of the stacked structure includes:
forming the first semiconductor layer, the active layer, and the second semiconductor layer over the substrate;
etching the second semiconductor layer and the active layer to form a mesa region exposing at least a portion of a surface of the first semiconductor layer;
forming a photoresist pattern on the mesa region, the photoresist pattern having an overhang structure;
forming a reflective metal layer on a surface of the second semiconductor layer exposed by the photoresist pattern; and
forming a conductive barrier layer over the reflective metal layer, wherein the conductive barrier layer extends over the second semiconductor layer.

13. The method of claim 11, wherein an area of the reflection pattern exposed through the first pad region is greater than an area of the conductive reflection layer exposed through the second pad region.

14. The method of claim 11, wherein, the forming of the first insulating layer includes forming the first insulating layer on a side surface of the LED module to have a thickness of an integer multiple of $\lambda/4$, when a wavelength of light generated in the active layer $\lambda$.

15. A light emitting diode (LED) module comprising:
a stacked structure including a first semiconductor layer, an active layer, a second semiconductor layer, and a reflection pattern that are formed over a substrate;
a first pad region formed over the reflection pattern to include a first insulation layer patterned to expose at least a portion of the reflection pattern;
a conductive reflection layer formed over the stacked structure;
a second pad region formed over the conductive reflection layer to include a second insulation layer patterned to expose at least a portion of the conductive reflection layer;
a first pad disposed over the first pad region to electrically connect the first pad region to the second semiconductor layer; and
a second pad disposed over the second pad region to electrically connect the second pad region to the first semiconductor layer.

16. The LED module of claim 15, wherein a size of the first pad is greater than a size of the second pad.

17. The LED module of claim 15, wherein the first and second pad regions include holes defined by the pattered first and second insulation layers, respectively, and the number of the holes in the first pad region is greater than the number of the holes in the second pad region.

18. The LED module of claim 15, wherein the active layer, the second semiconductor layer, and the reflection pattern have an inclined sidewall.

19. The LED module of claim 15, comprising:
a pad barrier layer formed over at least one of the first pad of the second pad.

20. The LED module of claim 15, comprising:
a phosphor layer disposed over at least one surface of the substrate.

* * * * *